United States Patent [19]
Podhrasky

[11] Patent Number: 4,709,213
[45] Date of Patent: Nov. 24, 1987

[54] METAL DETECTOR HAVING DIGITAL SIGNAL PROCESSING

[75] Inventor: Robert J. Podhrasky, Dallas, Tex.

[73] Assignee: Garrett Electronics, Inc., Garland, Tex.

[21] Appl. No.: 752,018

[22] Filed: Jul. 8, 1985

Related U.S. Application Data

[63] Continuation of Ser. No. 401,378, Jul. 23, 1982, abandoned.

[51] Int. Cl.[4] .......................... G01V 3/11; G01V 3/65; G01R 15/08; H03M 1/06

[52] U.S. Cl. .................................... 324/329; 324/115; 324/233; 340/347 M; 340/347 CC

[58] Field of Search ........ 324/225, 233, 239, 326–329, 324/339, 115, 131; 340/347 CC, 347 M

[56] References Cited

U.S. PATENT DOCUMENTS

| | | | |
|---|---|---|---|
| 2,497,961 | 2/1950 | Shaw | 324/131 X |
| 2,608,602 | 8/1952 | Muffly | 324/329 |
| 3,030,470 | 2/1962 | Shawhan et al. . | |
| 3,147,429 | 9/1964 | Moran . | |
| 3,202,909 | 8/1965 | Stewart . | |
| 3,209,245 | 9/1965 | Hauge . | |

(List continued on next page.)

FOREIGN PATENT DOCUMENTS

| | | |
|---|---|---|
| 637336 | 5/1950 | United Kingdom . |
| 1036629 | 7/1966 | United Kingdom . |
| 1534039 | 11/1978 | United Kingdom . |

OTHER PUBLICATIONS

Lancaster, Donald E. Electronic Metal Locators Basic Types and Design Factors *Electronics World* Dec. 1966 pp. 39–42 and 62.

Fisher, "M-Scope VLF 553D Detector Dual System Discriminator With Iso-Plannar Search Head Operator's Manual."

"Pulse Induction Metal Detectors," Published By Pulse Induction, Ltd., London.

"Auto-Pulse 1," A New Concept In Metal Detection.

Colani, C., "A New Type Of Locating Device," Archaeometry, vol. 9, 1969.

"Operation, Maintenance, Overhaul And List Of All Parts Manual For Detecting Set, Mine, Portable, Metallic Model P-158" Polan Industries, Inc.

"Operation, Maintenance, Overhaul And List Of All Parts Manual For Detecting Set, Mine, Aural Indication, 10-Volt DC . . . Woodcase," Oregon Technical Products, Aug. 9, 1963.

*Primary Examiner*—Gerard R. Strecker
*Attorney, Agent, or Firm*—Richards, Harris, Medlock & Andrews

[57] ABSTRACT

A metal detector circuit includes a transmit coil (12) and a receive coil (56) arranged in a balanced induction configuration in an electromagnetic field. The receive signal from the receive coil (56) is input to electronic switches (146, 148) which receive quadrature reference inputs from a phase shift circuit (112). The phase demodulated outputs of the switches (146, 148) are passed through amplifiers and input to an analog-to-digital converter (324) to produce digital signal samples which are transmitted through a bus (326). The bus (326) is connected to random access memory (414, 416) and a read only memory (418) which includes a stored signal processing program. A microprocessor (374) is connected to the bus (376) for receiving the digital signal samples and the stored program from memory (418). The microprocessor (374) executes the stored signal processing program to produce a digital output signal which is transmitted through the bus (326) to a digital-to-analog converter (360). The converter (360) produces an analog output signal which is passed to an output driver circuit which produces a target indication signal at a speaker (284). The digital signal processing provided by the microprocessor (374) includes concurrent ground cancellation and discrimination without the need for operator selection of these functions. The digital output produced by the microprocessor (374), upon detection of an object in the electromagnetic field, can be displayed in digital readouts (474–482).

27 Claims, 26 Drawing Figures

U.S. PATENT DOCUMENTS

| | | | |
|---|---|---|---|
| 3,214,686 | 10/1965 | Elliot et al. . | |
| 3,315,155 | 4/1967 | Colani . | |
| 3,328,679 | 6/1967 | Sloughter . | |
| 3,337,796 | 8/1967 | Hentschel et al. . | |
| 3,344,346 | 9/1967 | Halsey . | |
| 3,355,658 | 11/1967 | Gardiner . | |
| 3,383,594 | 5/1968 | Florletta et al. | 324/131 X |
| 3,391,336 | 7/1968 | Hentschel . | |
| 3,453,532 | 7/1969 | Gardiner . | |
| 3,467,855 | 9/1969 | Pance . | |
| 3,471,773 | 10/1969 | Penland . | |
| 3,487,294 | 12/1969 | Youmans et al. . | |
| 3,492,564 | 1/1970 | Baker, Jr. . | |
| 3,519,919 | 7/1970 | Rance . | |
| 3,555,408 | 1/1971 | Robinson . | |
| 3,559,041 | 1/1971 | Trigg | 324/131 X |
| 3,573,784 | 4/1971 | Bachofer et al. . | |
| 3,601,691 | 8/1971 | Gardiner . | |
| 3,614,600 | 10/1971 | Ronka . | |
| 3,626,279 | 12/1971 | Walden . | |
| 3,662,255 | 5/1972 | Garrett . | |
| 3,676,772 | 7/1972 | Lee . | |
| 3,686,564 | 8/1972 | Mallick, Jr. et al. . | |
| 3,721,859 | 3/1973 | Blanyer . | |
| 3,742,341 | 6/1973 | Clowes et al. . | |
| 3,758,849 | 9/1973 | Susman et al. . | |
| 3,760,400 | 9/1973 | Galvin et al. . | |
| 3,763,424 | 10/1973 | Bennett, Jr. et al. . | |
| 3,784,899 | 1/1974 | Chalfin . | |
| 3,823,365 | 7/1974 | Anderson . | |
| 3,828,242 | 8/1974 | Vann . | |
| 3,848,182 | 11/1974 | Gerner et al. . | |
| 3,852,659 | 12/1974 | Barringer . | |
| 3,852,663 | 12/1974 | Brooks et al. . | |
| 3,872,380 | 3/1975 | Gardiner . | |
| 3,896,371 | 7/1975 | Hametta . | |
| 3,906,376 | 9/1975 | Bass . | |
| 3,950,695 | 4/1976 | Barringer . | |
| 3,950,750 | 4/1976 | Churchill et al. . | |
| 3,961,238 | 6/1976 | Randolph, Jr. . | |
| 3,972,041 | 7/1976 | Howard . | |
| 3,986,104 | 10/1976 | Randolph, Jr. . | |
| 3,999,965 | 11/1976 | Purinton et al. . | |
| 4,008,469 | 2/1977 | Chapman . | |
| 4,016,486 | 4/1977 | Pecori . | |
| 4,024,468 | 5/1977 | Hirschi . | |
| 4,053,885 | 10/1977 | Tomita et al. . | |
| 4,086,527 | 4/1978 | Cadot | 324/233 |
| 4,096,432 | 6/1978 | Spencer . | |
| 4,099,116 | 7/1978 | Tyndall . | |
| 4,110,679 | 8/1978 | Payne . | |
| 4,128,803 | 12/1978 | Payne . | |
| 4,130,792 | 12/1978 | Sullivan . | |
| 4,204,160 | 5/1980 | Voll . | |
| 4,207,520 | 6/1980 | Flora et al. | 324/233 X |
| 4,213,093 | 7/1980 | Pecori . | |
| 4,230,987 | 10/1980 | Mordwinken | 324/233 X |
| 4,249,128 | 2/1981 | Karbowski . | |
| 4,255,710 | 5/1981 | Weber . | |
| 4,255,711 | 3/1981 | Thompson . | |
| 4,263,553 | 4/1981 | Cook et al. . | |
| 4,303,879 | 12/1981 | Podhrasky . | |
| 4,321,583 | 3/1982 | Baron et al. | 340/347 CC |
| 4,322,683 | 3/1982 | Vieira et al. | 324/233 X |
| 4,326,166 | 4/1982 | Pigeon et al. | 324/225 |
| 4,331,920 | 5/1982 | Kalisch et al. | 324/225 |
| 4,348,639 | 9/1982 | Karbowski | 324/329 |
| 4,383,218 | 5/1983 | Hansen et al. | 324/225 |
| 4,455,529 | 6/1984 | Sinclair | 324/339 |
| 4,517,550 | 5/1985 | Nakamura et al. | 340/347 CC |
| 4,556,846 | 12/1985 | D'Hondt | 324/225 X |
| 4,563,645 | 1/1986 | Kerr | 324/329 |
| 4,564,809 | 1/1986 | Huschelrath et al. | 324/225 |

418
READ ONLY MEMORY
416
RANDOM ACCESS MEMORY
414
RANDOM ACCESS MEMORY
430
LATCH DECODE
374
MICRO-PROCESSOR
VDD
VCC
XTAL
CLR
VSS
CK
TPA
MWR
MRD
CK
CE3
CE2
DB0 DB1 DB2 DB3 DB4 DB5 DB6 DB7
N2 N1 N0
TPB
EF4 EF3 EF2 EF1
Q
VL

METAL DETECTOR HAVING DIGITAL SIGNAL PROCESSING

This application is a continuation of application Ser. No. 401,378 filed July 23, 1982, now abandoned.

TECHNICAL FIELD

The present invention pertains to electronic metal detector circuits and in particular to metal detector circuits which provide ground cancellation and target discrimination.

BACKGROUND OF THE INVENTION

Induction balance metal detectors are widely used for the detection of ferromagnetic and conductive bodies hidden beneath the surface of the earth. One problem encountered with the use of these detectors is the generation of spurious signals due to the presence of mineralized soil. It is known that the phase between the transmit and receive signals of a metal detector can vary as a function of the electrical nature of the material within the field of a search coil. Such phase information has been utilized to reduce the extraneous signals caused by mineralized soil as well as to provide a degree of discrimination between classes of targets.

It has been the usual procedure to search with a metal detector set in a ground cancellation mode until an object is detected. The detector is then switched to a discrimination mode to attempt classification to determine whether the detected object is of interest. This procedure requires the operator to initially adjust the metal detector to have a specific ground cancellation condition as well as a specific discrimination condition. These conditions are set up by adjusting potentiometers which control phase shift circuits. The effectiveness of these adjustments, to a substantial extent, depends upon the operator's experience and skill. The ground cancellation adjustment can prove to be a particular problem since it is somewhat time consuming and soil conditions can vary even within a small area. The analog circuitry of a metal detector also has the tendency to drift due to thermal and battery conditions. The net result of these factors often is considerable inconvenience to the operator due to the necessity of frequent circuit adjustment.

Once an object is detected with a conventional metal detector, the response is provided to the operator by means of an audio signal or a meter reading. These indications provide nothing more than an indication that an object has been detected and that it may be within a very broad class, as determined by the discrimination setting. The output provided to the operator is basically a yes/no response rather than a qualitative indication of the nature of the material in the field of the search coil.

In view of the above limitations regarding conventional metal detector circuits there exists a need for an advanced metal detector which can evaluate target information with a substantial degree of precision. The inconvenience to the operator caused by the need to set ground cancellation conditions should be substantially reduced or eliminated. Discrimination setting should be adjustable quantitatively and with great precision. Further, the detailed and more precise signal information produced as a result of enhanced signal processing should provide a quantitative output to the operator resulting in much greater knowledge of the nature of the material within the field of the metal detector search coil.

SUMMARY OF THE INVENTION

A selected embodiment of the present invention is a metal detector circuit which includes an oscillator for generating a transmit signal and a transmit coil for receiving the transmit signal therethrough to generate an electromagnetic field. A receive coil is positioned in the electromagnetic field for generating a receive signal through inductive coupling from the transmit coil. A phase demodulation circuit receives the transmit and receive signals and produces first and second phase demodulated signals. The first and second phase demodulated signals are digitized to produce digital signal samples. A digital communication bus is connected to receive the digital signal samples from the digitizing circuit. A digital memory is connected to the communication bus and includes a stored program therein. A microprocessor is connected to the communication bus and serves to execute the stored program to process the digital signal samples and generate a digital output signal for indicating detection of an object in the electromagnetic field. Further circuit means are provided which are connected to the microprocessor for receiving the digital output signal and generating therefrom a target indication signal for an operator.

BRIEF DESCRIPTION OF THE DRAWINGS

For a more complete understanding of the present invention and the advantages thereof, reference is made to the following Detailed Description taken in conjunction with the accompanying Drawings in which.

DETAILED DESCRIPTION

An induction balance metal detector is described which utilizes analog circuitry to transmit and receive a signal as well as to perform phase demodulation. Following the phase demodulation the information signals are digitized for processing.

In the embodiment of the present invention described herein there are shown four independent power supplies designated as $V_A$, $V_R$, $V_L$, and $V_S$. The voltage $V_A$ powers the analog circuitry and is typically 12 volts, $V_R$ is a stable reference voltage and is typically 5 volts, $V_L$ powers the digital logic circuitry and is typically 5 volts, and $V_S$ powers the sound or audio output circuitry and is typically 9 volts. There are included three ground symbols, one for digital ground, one for analog ground and one for the audio or sound circuit. The digital ground is indicated by a downward facing arrow, the analog ground is indicated by three parallel lines at a slant, and the audio ground is indicated by a series of horizontal lines of decreasing length forming a triangle. These three distinct ground paths are used to eliminate interference between the circuits due to currents in the ground paths.

Figure 1:
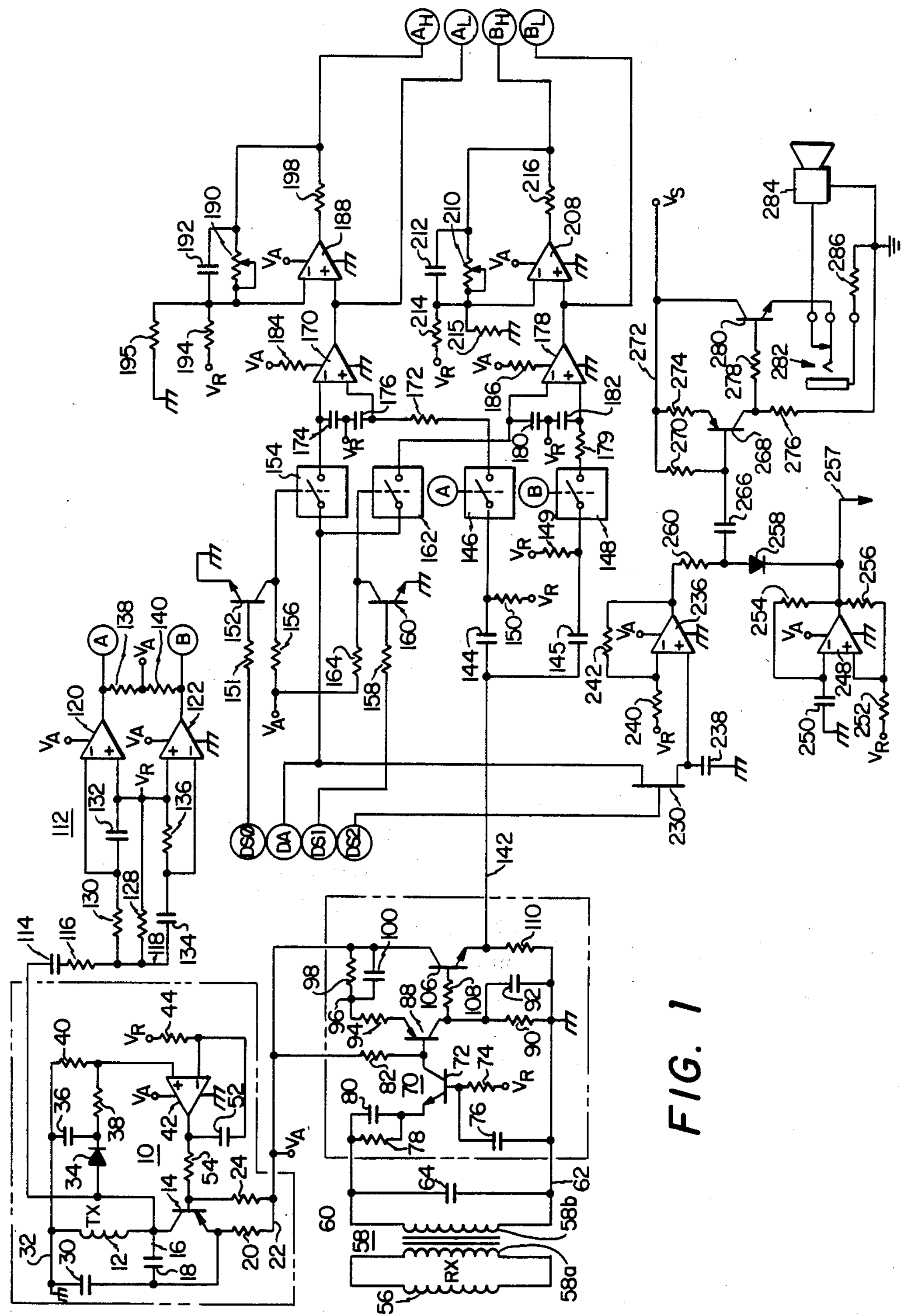
FIG. 1 is a schematic illustration of metal detector analog signal generation, collection and demodulation and of the output driver of the metal detector circuit of the present invention.

Referring now to FIG. 1, the metal detector circuit for the described embodiment of the present invention includes an oscillator 10 for generating a sinusoidal signal that is passed through a transmit coil 12. The oscillator 10 includes a PNP transistor 14 which has its collector terminal connected to a node 16 which is in turn connected to a first terminal of the transmit coil 12. A capacitor 18 is connected between the collector and emitter terminals of transistor 14. A resistor 20 is connected between the emitter of transistor 14 and a power terminal 22 connected to the $V_A$ supply. A resistor 24 is connected between the base terminal of transistor 14 and the power terminal 22.

A capacitor 30 is connected between the emitter terminal of transistor 14 and a node 32 which is connected to the analog ground. The transmit coil 12 is connected between node 32 and node 16.

A diode 34 has the anode terminal thereof connected to node 16. A capacitor 36 is connected between node 32 and the cathode terminal of diode 34. A pair of resistors 38 and 40 are connected in series between node 32 and the junction of diode 34 and capacitor 36.

The junction of resistors 38 and 40 is connected to the noninverting input of a differential amplifier 42. A resistor 44 is connected between the inverting input of amplifier 42 and its reference voltage $V_R$. A capacitor 52 is connected between the output of amplifier 42 and its inverting input. A resistor 54 is connected between the output of amplifier 42 and the base terminal of transistor 14. Preferably, the frequency of oscillator 10 is approximately 5 KHZ.

The metal detector circuit of the present invention further includes, a receive coil 56 which is physically located to be in a balanced induction configuration with the transmit coil 12. The receive coil 56 is connected to a transformer 58 through a primary coil 58*a*. Transformer 58 includes a secondary coil 58*b* which is connected between nodes 60 and 62. Node 62 is connected to the analog ground. A capacitor 64 is also connected between nodes 60 and 62.

The receive signal from coil 56 is transmitted through transformer 58 to a preamplifier circuit which is designated generally as 70. The preamplifier 70 includes an NPN transistor 72 which has its base terminal connected through a resistor 74 to the reference voltage $V_R$. A capacitor 76 is connected between the base terminal of transistor 72 and node 62, analog ground. A resistor 78 is connected between node 60 and the emitter terminal of transistor 72. A capacitor 80 is connected in parallel with resistor 78. A resistor 82 is connected between the collector terminal of transistor 72 and $V_A$ supply at terminal 22.

The preamplifier 70 further includes a PNP transistor 88 which has its base terminal connected to the collector terminal of transistor 72. A resistor 90 is connected between the collector terminal of transistor 88 and ground node 62. A capacitor 92 is connected in parallel with resistor 90. A resistor 94 is connected between the emitter terminal of transistor 88 and a node 96. A resistor 98 is connected between node 96 and the power terminal $V_A$ at terminal 22. A capacitor 100 is connected in parallel with resistor 98.

The preamplifier 70 further includes an NPN transistor 106 which has its collector terminal connected to the power terminal $V_A$ at terminal 22. A resistor 108 is connected between the base terminal of transistor 106 and the collector terminal of transistor 88. A resistor 110 is connected between the emitter terminal of transistor 106 and the ground node 62.

The sinusoidal signal generated by the oscillator 10 is also transmitted from node 16 to a phase shift circuit 112. The transmit signal from oscillator 10 is passed serially from node 16 through a capacitor 114 and a resistor 116 to a node 118. Phase shift circuit 112 includes voltage comparators 120 and 122. The noninverting inputs of comparators 120 122 are connected to the $V_R$ supply.

A resistor 128 is connected between node 118 and the $V_R$ supply. A resistor 130 is connected between node 118 and the inverting input of comparator 120. A capacitor 132 is connected between the inverting and noninverting inputs of comparator 120. A capacitor 134 is connected between node 118 and the inverting input of comparator 122. A resistor 136 is connected between the inverting and noninverting inputs of comparator 122.

The output of comparator 120 comprises a phase reference signal for a channel A of the metal detector circuit. This phase reference signal is transmitted through a node A. The output of comparator 122 comprises the phase reference signal for a channel B. This reference signal is transmitted through a node B. Resistors 138 and 140 are connected in series between the outputs of comparators 120 and 122. The $V_A$ supply is connected to the junction of resistors 138 and 140.

Figure 3:
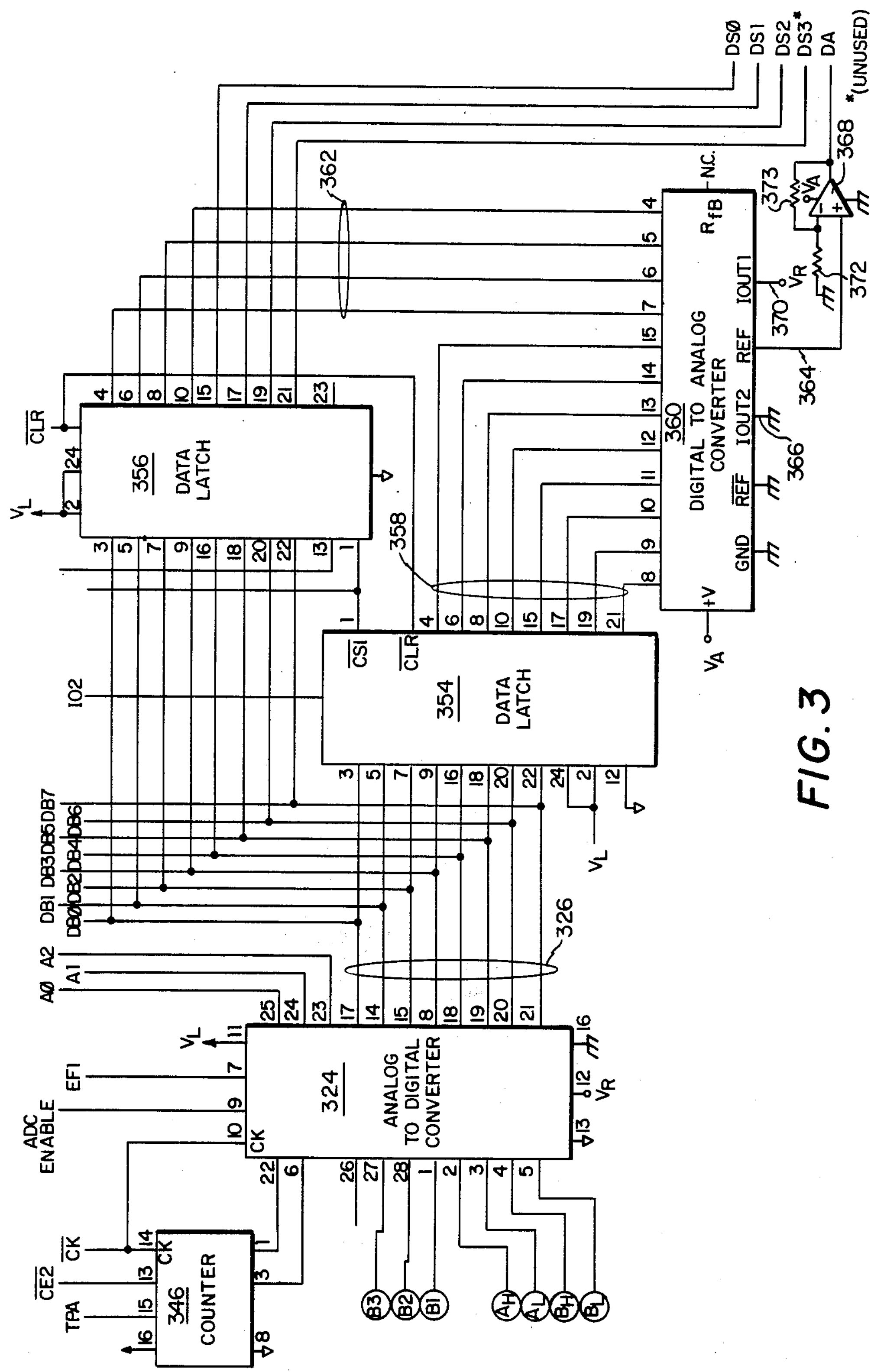
FIG. 3 is a block diagram and schematic illustration of analog-to-digital and digital-to-nalog conversion circuitry.

The digital circuitry portion of the present invention generates a group of destination select signals which are labeled DSO, DSl and DS2. The source of these signals is shown in FIG. 3. The digital circuitry also generates an analog signal which is labeled DA. These signals are input to the analog circuitry shown in FIG. 1.

The receive signal from preamplifier 70 is transmitted from the emitter terminal of transistor 106 through a line 142 to first terminals of capacitors 144 and 145. The second terminal of capacitor 144 is connected to the input terminal of electronic switch 146. The second terminal of capacitor 145 is connected to the input terminal of an electronic switch 148. A resistor 150 is connected between the input of the switch 146 and voltage supply $V_R$ and a resistor 149 is connected between the input of switch 148 and reference voltage supply $V_R$. The channel A phase reference signal from comparator 120 is transmitted through node A to the control input of switch 146. The channel B phase reference signal is transmitted through node B to the control input of switch 148. The switches 146 and 148 serve as a means for phase demodulating the receive signal in response to the reference signals provided to the control inputs thereof. The phase shift circuit 112 is a means for providing first and second relative phase relations between the reference signals derived from the transmit signal and receive signal provided to the phase demodulation switches 146 and 148.

The data select signal DSØ is transmitted through a resistor 151 to the base terminal of an NPN transistor 152. The emitter of transistor 152 is connected to the analog ground. The collector of transistor 152 is connected to the control input of an electronic switch 154 and through a resistor 156 to the power supply $V_A$.

The DSl signal is transmitted through a resistor 158 to the base terminal of an NPN transistor 160 which has its emitter terminal connected to the analog ground. The collector terminal of transistor 160 is connected to the control input of an electronic switch 162. The collector terminal is further connected through a resistor 164 to the power supply $V_A$.

The DA signal is provided to the inputs of switches 154 and 162. The output of switch 154 is connected to the inverting input of an amplifier 170. The output of switch 146 is connected through a resistor 172 to the noninverting input of amplifier 170. Amplifier 170 is designed to have a fixed gain. A pair of capacitors 174 and 176 are connected in series between the noninverting and inverting inputs of amplifier 170. The junction of capacitors 174 and 176 is connected to the reference voltage supply $V_R$.

The output from switch 162 is provided to the inverting input of a fixed gain amplifier 178. The output of switch 148 is transmitted through a resistor 179 to the noninverting input of amplifier 178. A pair of capacitors 180 and 182 are connected in series between the noninverting and inverting inputs of amplifier 178. The junction of capacitors 180 and 182 is connected to the reference voltage $V_R$.

The amplifiers 170 and 178 receive power from the $V_A$ supply through resistors 184 and 186 respectively.

The amplifiers 170 and 178 are provided with offset voltages which are stored respectively across capacitors 174 and 180. These offset voltages are provided through the line DA and serve to bring the outputs of amplifiers 170 and 178 to within a desired operating range.

The output from amplifier 170 is provided to the noninverting input of an operational amplifier 188. A parallel combination of a potentiometer 190 and a capacitor 192 has a first terminal connected to the inverting input of amplifier 188. A resistor 194 is connected between the inverting input of amplifier 188 and the reference voltage $V_R$. A resistor 195 is connected between the inverting input of amplifier 188 and the analog ground.

The output of amplifier 170 is further transmitted to a terminal labeled $A_L$. The output of amplifier 188 is transmitted through a resistor 198 to a terminal labeled $A_H$. The second terminal of the parallel combination of potentiometer 190 and capacitor 192 is also connected to the terminal $A_H$. The signal at terminal $A_L$ is amplified to produce the signal at terminal $A_H$. Therefore the signal of $A_L$ is a lower amplitude signal and the signal at terminal $A_H$ is a higher amplitude signal. The signal at $A_H$ is 256 times the amplitude of the signal $A_L$ although both signals convey essentially the same information. $A_H$ represents the high level A channel signal and $A_L$ represents the low level A channel signal.

The output of amplifier 178 is provided to the noninverting input of an operational amplifier 208. The parallel combination of a potentiometer 210 and a capacitor 212 has a first terminal connected to the inverting input of amplifier 208. A resistor 214 is connected between the inverting input of amplifier 208 and the reference voltage $V_R$. A resistor 215 is connected between the inverting input of amplifier 208 and the analog ground. The output of amplifier 208 is transmitted through a resistor 216 to a terminal labeled $B_H$. The second terminal of the parallel combination of potentiometer 210 and capacitor 212 is also connected to the terminal $B_H$.

The output of amplifier 170 is further transmitted to a terminal labeled $B_L$. As with channel A noted above the signal at the $B_H$ terminal is 256 times greater in amplitude than the signal at the $B_L$ terminal although both signals convey essentially the same information. $B_H$ is the high level B channel signal and $B_L$ is the low level B channel signal.

The DS2 signal is connected to the gate terminal of a field effect transistor 230. The analog signal DA is provided to the drain terminal of transistor 230. The source terminal of transistor 230 is connected to the noninverting input of an operational amplifier 236. A capacitor 238 is connected between the noninverting input of amplifier 236 and the analog ground. A resistor 240 is connected between the inverting input of amplifier 236 and reference voltage supply $V_R$. A resistor 242 is connected between the output and the inverting input of amplifier 236.

The disclosed embodiment for the metal detector circuit of the present invention further includes an audio oscillator, a tone generator, which includes an operational amplifier 248 which has a capacitor 250 connected between the inverting input of amplifier 248 and analog ground. A resistor 252 is connected between the noninverting input of amplifier 248 and the reference voltage $V_R$. A resistor 254 is connected between the output and inverting input of amplifier 248. A resistor 256 is connected between the output and the noninverting input of the amplifier 248. An oscillatory signal at audio frequency is produced at the output of amplifier 248 and is transmitted through a line 257 to an LCD backplane drive shown in FIG. 5. A diode 258 has its cathode terminal connected to the output of amplifier 248. A resistor 260 is connected between the output of amplifier 236 and the anode terminal of diode 258. Upon detection of an object in the field of the transmit and receive coils 12 and 56, the DA and DS2 signals are set to a state to permit the oscillatory signal from amplifier 248 to be propagated through diode 258 and a capacitor 66 to the base terminal of a PNP transistor 268. A resistor 270 is connected between the power supply terminal $V_S$ at a node 272 and the base terminal of transistor 268. A resistor 274 is connected between the power supply terminal $V_S$ at node 272 and the emitter terminal of transistor 268. A resistor 276 is connected between the audio ground and the collector terminal of transistor 268.

A resistor 278 is connected between the collector terminal of transistor 268 and the base terminal of an NPN transistor 280. The transistor 280 has its collector terminal connected to the power supply terminal $V_S$ and its emitter terminal connected to a center pole of a switch 282. A first terminal of the switch 282 is connected to a speaker 284 which has a second terminal connected to the circuit audio ground. A second terminal of the switch 282 is connected through a resistor 286 to the circuit audio ground. The switch 282 includes a socket for receiving an earphone plug to provide the audio output to the earphone while interrupting the signal provided to the speaker 284.

The transistors 268 and 280 comprise the output circuit driver transistors for the metal detector circuit.

Figure 2A:
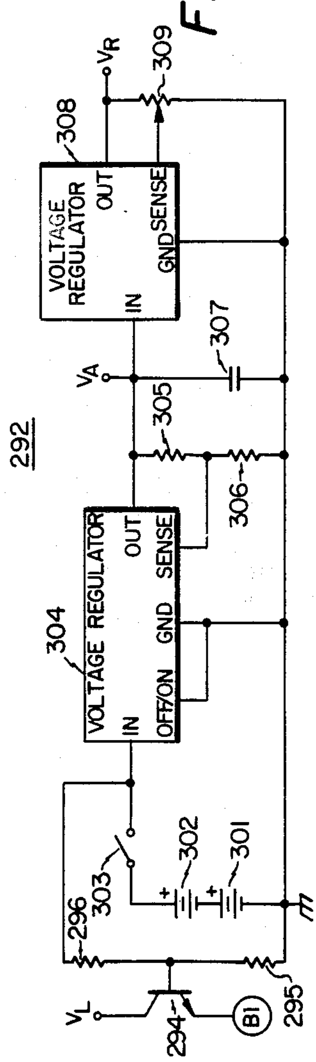
FIGS. 2A, 2B and 2C are schematic illustrations of the power supplies for the circuits of the present invention.
Figure 2B:
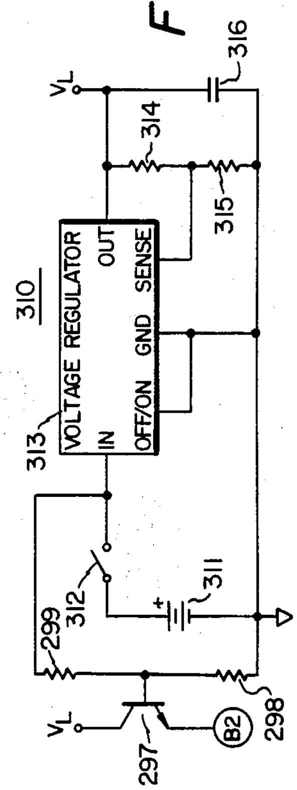
Figure 2C:
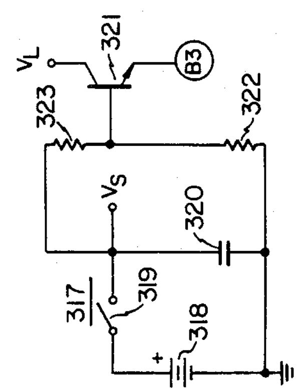

Power supply circuits for the metal detector circuit of the present invention are shown in FIGS. 2A, 2B and 2C. The circuit for producing the voltage supplies $V_A$ and $V_R$ is shown in FIG. 2A and is designated generally by the reference numeral 292. An NPN transistor 294 has its collector connected to a voltage supply $V_L$ and its emitter connected to a terminal B1. A resistor 295 is connected between the base of transistor 294 and the analog ground. A resistor 296 has a first terminal connected to the base terminal of transistor 294. Power supply circuit 292 includes batteries 301 and 302 which are connected in series between the analog ground and the switch arm of a switch 303. The second terminal of switch 303 is connected to the input of a voltage regulator circuit 304. This input is also connected to the second terminal of resistor 296. The circuit 292 includes resistors 305 and 306 which are connected serially between the output of voltage regulator 304 and the analog ground. A sense terminal of regulator 304 is connected to the junction of resistors 305 and 306. A filter capacitor 307 is connected between the power supply terminal $V_A$, which is the output of the voltage regulator 304, and the circuit analog ground. The input of a second voltage regulator 308 is connected to the power terminal $VA$. A potentiometer 309 is connected between the analog ground and the output of voltage regulator 308. The output of the voltage regulator 308 is a stable reference voltage designated $V_R$.

Referring now to FIG. 2B there is shown a circuit 310 for producing the supply voltage $V_R$. A battery 311 is connected between logic ground and the switch arm of a switch 312. The remaining terminal of switch 312 is connected to the input of a voltage regulator curcuit 313. The circuit includes resistors 314 and 315 which are connected serially between the output of voltage regulator 313 and digital ground. A filter capacitor 316 is connected between the power terminal $V_L$, which is the output of the voltage regulator 313 and the circuit digital ground. A sense terminal from regulator 313 is connected to the junction of resistors 314 and 315.

An NPN transistor 297 has its collector terminal connected to the $V_L$ supply and its emitter connected to a terminal B2. A resistor 298 is connected between the base terminal of transistor 294 and the digital ground. A resistor 299 is connected between the base terminal of transistor 297 and the IN terminal of voltage regulator 310.

Referring to FIG. 2C, a power supply circuit 317 produces the supply voltage $V_S$. A battery 318 has its negative terminal connected to the circuit analog ground and its positive terminal connected to the switch arm of a switch 319. A capacitor 320 is connected between the static terminal of switch 319, which is also the sound or audio power supply $V_S$, and the audio ground. An NPN transistor 321 has its collector terminal connected to the $V_L$ supply and its emitter terminal connected to a terminal B3. A resistor 322 is connected between the base terminal of transistor 321 and the audio ground. A resistor 323 is connected between the $V_S$ power terminal and the base of transistor 321.

The analog input/output circuitry for the metal detector of the present invention is shown in FIG. 3. The high and low level signals for the A and B channels are input to an analog-to-digital converter 324. The battery monitor terminals B1, B2 and B3 are also input to converter 324. There are eight selectable inputs to the converter 324. In the present embodiment seven of these inputs are utilized.

Address signals A0, A1 and A2 are provided to the converter 324 to select which of the input lines is to be sampled. When an input analog signal is sampled, an eight-bit digital word is produced at the output terminals of converter 324 and this word is transmitted through an eight-bit wide data bus 326. The data bits transmitted through bus 326 are labeled DB0 through DB7.

A counter 346 uses timing and chip enable information to sequentially load the correct address and start the conversion cycle of the analog-to-digital converter 324.

The data bus 326 is further connected to the inputs of latches 354 and 356 each of which can store an eight-bit word of binary data. The eight data outputs of latch 354 are transmitted through a bus 358 to eight of the input terminals of a digital-to-analog converter 360. Four of the outputs from the latch 356 are transmitted through a bus 362 to the remaining four inputs of the digital-to-analog converter 360 to provide twelve-bit resolution. The converter 360 receives a twelve-bit input and generates a corresponding analog output at line 364. Analog output line 366 is connected to analog ground while analog input line 370 is connected to reference voltage $V_R$. A fixed gained differential amplifier 368 has the output line 364 connected to its noninverting input. A resistor 372 is connected between the inverting input of amplifier 368 and the analog ground. A resistor 373 is connected between the inverting input of amplifier 368 and the output of amplifier 368. The output of amplifier 368 is the analog signal noted as DA above. The power terminals for amplifier 368 are the supply $V_A$ and analog ground.

Only four of the outputs from the latch 356 are provided to the converter 360. Three of the remaining outputs provide the destination select signals DS0, DS1 and DS2. The last remaining output of latch 356 is not currently utilized.

Figure 4:
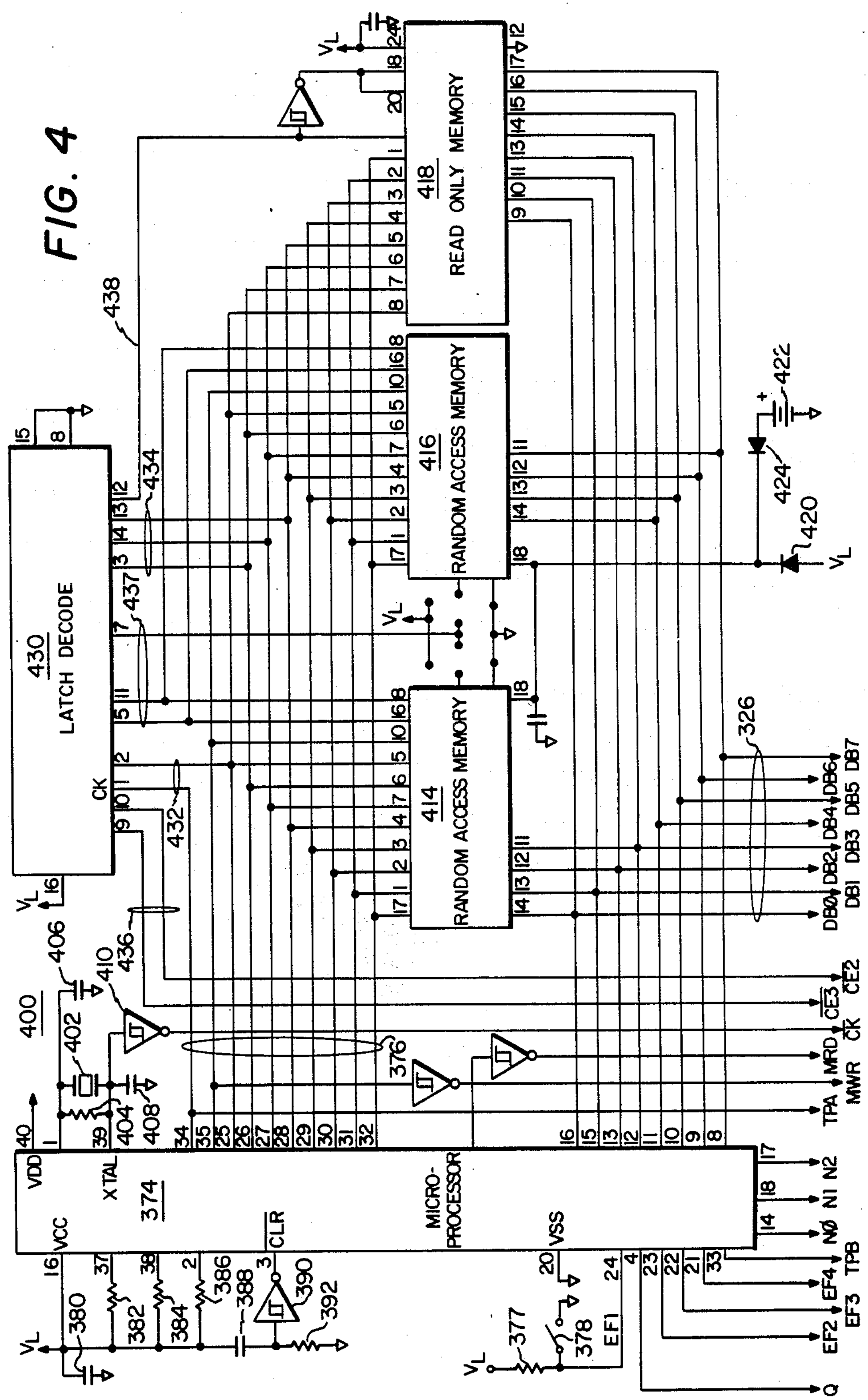
FIG. 4 is a block and schematic illustration of a microprocessor, bus and memory utilized in the present invention.

The microprocessor central processing unit and memory of the metal detector circuit are shown in FIG. 4. A microprocessor 374 performs the data acquisition and signal processing for the detection and classification of objects encountered in the field of the search coil. The processor 374 is connected to the eight lines of the data bus 326 for transmitting and receiving data words over the bus. The processor 374 further generates memory address signals which are transmitted through an eight-bit address bus 376. Control flags Q, EFl, EF2, EF3 and EF4 are monitored and/or set up by operation of the processor 374. The processor further generates control signals N0, N1 and N2. Memory read and memory write commands are transmitted respectively through lines marked MRD and MRW. A resistor 377 is connected between line EF1 and the voltage supply $V_L$. A switch 378 is connected between digital ground and line EF1. The switch 378 is mounted for easy access by an operator. Operation of switch 378 generates a control flag for line EF1 which is used by microprocessor 374 to initialize the signal processing system of the metal detector.

The microprocessor 374 is powered by the logic voltage $V_L$. Capacitor 380 is connected between power supply terminal $V_L$ and the digital ground to suppress power line transients. Resistors 382, 384, and 386 are connected between power terminal $V_L$ and the microprocessor terminals $\overline{DMAOUT}$ (37), $\overline{DMAIN}$ (38), and $\overline{WAIT}$ (2), respectively to control unused input lines.

capacitor 388 is connected between the $V_L$ terminal and the input to a Schmidt trigger 390. The output of the trigger 390 is connected to the clear input ($\overline{CLR}$) of the microprocessor 374. A resistor 392 is connected between the input of the trigger 390 and the digital ground.

An oscillator circuit 400 provides a reference clock signal for operation of the microprocessor 374 as well as providing a clock signal for other portions of the metal detector circuit. The circuit 400 includes a crystal 402 which is connected between the CK and XTAL terminals of the microprocessor 374. A resistor 404 is connected in parallel with the crystal 402. A capacitor 406 is connected between the CK terminal and the digital ground. A capacitor 408 is connected between the XTAL terminal and the digital ground. A Schmidt trigger circuit 410 has its input connected to the XTAL terminal of the microprocessor 374.

Microprocessor 374 generates timing pulses TPA and TPB which are utilized to sequence the operation of the memories as well as other logical units in the circuit.

The memory address bus 376 from microprocessor 374 is connected to the address input of random access memories (RAM) 414 and 416 and to the address inputs of a read only memory (ROM) 418. The data bus 326 has the data bit lines DB0, DB1, DB2 and DB3 connected to the four data output terminals of RAM 414. The data bit lines DB4, DB5, DB6 and DB7 are connected to the four data output terminals of RAM 416. All of the lines of data bus 326 are connected to the output data terminals of ROM 418.

The random access memories 414 and 416 are powered from the +5 volt supply $V_L$ which is transmitted through a diode 420 to the VDD terminals of the RAMS 414 and 416. A battery supply is also provided by battery 422 which has the negative terminal thereof connected to the digital ground and the positive terminal connected to the anode terminal of a diode 424. The cathode terminal of the diode 424 is connected to the power input terminals VDD of the RAMS 414 and 416. This circuit allows retention of information in the RAMS 414 and 416 when the balance of the circuitry is switched off.

A latch decode circuit 430 allows the processor 374 to address the appropriate memory or I/0 element of the circuit. Address lines 432 and 434 provide valid information during a specified portion of each machine cycle for processor 374 and are decoded and latched on lines 436, 437 and 438.

Figure 5:
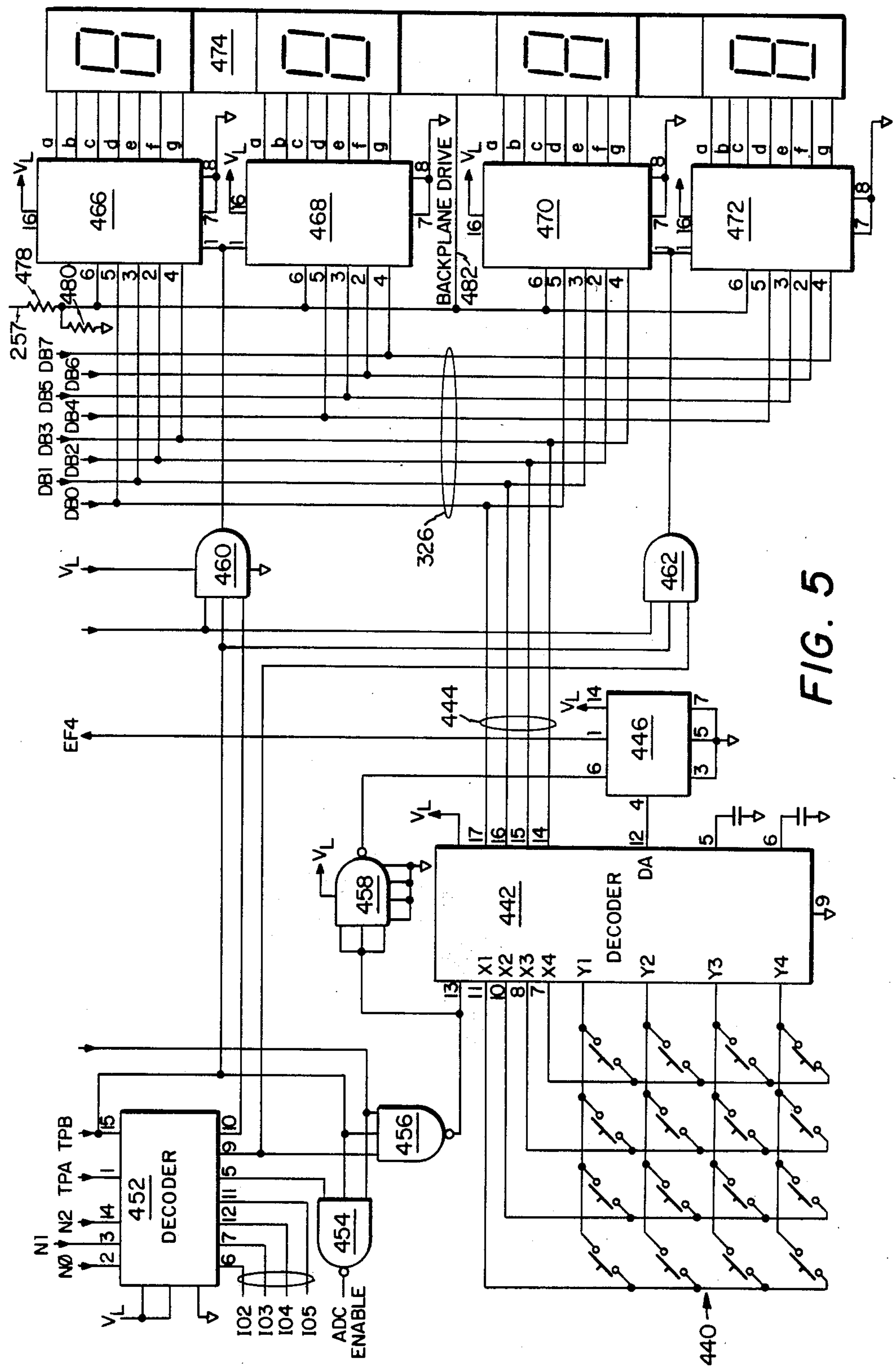
FIG. 5 is a block and schematic illustration of keyboard input and the digital output circuitry of the present invention.

Additional address decoding circuitry is shown in FIG. 5. A decoder 452 combines processor control signals NØ, N1, N2 and timing signals TPA and TPB to control the I/O devices. A nand gate 454 further decodes the output of decoder 452 to provide an address enable for analog-to-digital converter 328. A nand gate 456 enables the output of keyboard decoder 442. A nand gate 458 resets the data ready flag of latch 446. A nand gate 458 resets the data ready flag of latch 446. A nand gate 460 enables a data transfer to the two most significant digits of the LCD drivers while a nand gate 462 enables a data transfer to the two least significant digits of the LCD drivers.

The keyboard and display interface for the metal detector circuit of the present invention are illustrated in FIG. 5. A keyboard 440 has sixteen keys arranged in four columns and four rows. Each of the column lines for the keyboard is input to a respective one of the column inputs $X_1$, $X_2$, $X_3$ and $X_4$ of a keyboard decoder 442. The row lines of the keyboard 440 are input to the $Y_1$, $Y_2$, $Y_3$ and $Y_4$ inputs of the decoder 442. A data acquisition output signal is generated at the DA terminal of the decoder 442 upon detection of a closure of any one of the switches of the keyboard 440. The decoded keyboard signal is transmitted through a four line bus 444 to the data bits DB0, DB1, DB2 and DB3 of the data bus 326.

The data acquisition signal from the DA terminal of decoder 442 is provided to a latch circuit 446 which sets the flag EF4 to indicate to the microprocessor 374 that a keyboard input has been initiated.

The data bus lines 326 are further connected to liquid crystal display latch drivers 466, 468, 470 and 472. The data bit lines DB0, DB1, DB2 and DB3 are connected to drivers 466 and 470. The data bit lines DB4, DB5, DB6 and DB7 are connected to the drivers 468 and 472. The outputs of the drivers 466–472 are connected to a four digit, seven segment, digital, liquid crystal display 474. The seven segment drive lines are shown as a, b, c, d, e, f and g. The back plane drive for the liquid crystal displays is provided through a line 482. Line 482 is connected to the junction of resistors 478 and 480. The remaining terminal of resistor 480 is connected to the digital ground. The remaining terminal of resistor 478 is connected to the output of amplifier 48 through line 257.

The metal detector includes a digital signal processing means which includes the digital units 354, 356, 360, 374, 414, 416, 418, 430, 442 and associated digital components. This digital signal processing means receives digital signal samples from the analog-to-digital converter 324, processes the samples in accordance with a stored signal processing program and produces an output signal at the output of the digital-to-analog converter 360. This output signal drives an audio output circuit, shown in FIG. 1, to generate a target indication signal at speaker 284.

The functional blocks described above are listed below together with a representative product identification for each listed functional block.

| Reference Number | Part No. | Manufacturer |
|---|---|---|
| 146, 148, 154, 162 | CD4016 | RCA |
| 304, 310 | LM2931T | National Semiconductor |
| 324 | ADC807 | National Semiconductor |
| 308 | REF02 | Precision Monolithics |
| 346 | CD4022 | RCA |
| 354, 356 | CDP1852 | RCA |
| 360 | AD7521 | National Semiconductor |
| 374 | CDP1802 | RCA |
| 414, 416 | MWS5114 | RCA |
| 418 | CDP1834 | RCA |
| 430 | CDP1859 | RCA |
| 442 | 74C922 | National Semiconductor |
| 452 | CDP1853 | RCA |
| 466, 468, 470, 472 | 4056 | RCA |
| 474, LCD | FE502 | AMD |

Operation

Operation of the metal detector circuit of the present invention is now described in reference to the FIGURES. Referring first to FIG. 1, the oscillator 10 produces a sinusoidal signal at approximately 5 KHZ and passes this signal through the transmit coil 12. This produces an electromagnetic field. Although a sinusoidal transmit signal is preferred, other types of periodic signals can be used with the circuit of the present invention.

The transmit coil 12 and receive coil 56 comprise a search coil which is fabricated in a balanced induction configuration such that there is a net zero induced signal in the receive coil from the transmit coil in the absence of ferromagnetic or conductive objects in the field of the coils. When such objects are brought in the vicinity of the transmit and receive coils, the field is unbalanced and a signal from the transmit coil 12 is induced into the receive coil 56. The receive signal is at the same frequency as the transmit signal but is amplitude and phase offset as a function of the nature of the material in the electromagnetic field. The receive signal passes through transformer 58 and preamplifier 70.

The receive signal is provided to the inputs of switches 146 and 148. At this point the receive signal is processed through two channels, A and B. The switch control, reference inputs A and B, are square wave signals derived from the transmit signal produced by oscillator 10. The phase shift circuit 112 produces a relative phase shift of 90° between the reference signals A and B. For the signal processing of the present invention it is preferred that the phase offset of the signals A and B be as close to 90°, quadrature, as possible.

The reference input signals A and B provided to the switches 146 and 148 serve to phase demodulate the receive signal. The resulting phase demodulated signals are low pass filtered by operation of resistor 172 and capacitor 176 for switch 146 and resistor 179 and capacitor 182 for switch 148. A DC signal is established across these capacitors wherein this signal is proportional to the phase related amplitude content of the receive signal determined by the reference signal control input to the corresponding switch.

The phase demodulated signals are input to the non-inverting input terminals of amplifiers 170 and 178. The inverting inputs receive an offset signal which is stored across the capacitors 174 and 180 respectively for the amplifiers 170 and 178. The amplitude of the offset signal is determined by the signal processing carried out by the microprocessor, described below. The offset signal for each of the amplifiers 170 and 178 is input through the signal DA and selectively applied to the capacitors 174 and 180 by operation of the switches 154 and 162. The signals DS0 and DS1 respectively operate the switches 154 and 162 for applying the DA signal to the capacitors 174 and 180. The offset signals input to the amplifiers 170 and 178 serve to bring the output of the amplifiers within the desired operating range. Amplifiers 170 and 178 preferably have a fixed gain of 10.

The phase demodulated receive signals at the outputs of amplifiers 170 and 178 have a relatively low amplitude. These phase demodulated signals are input respectively to amplifiers 188 and 208, each of which preferably has a gain of 256. The low amplitude phase demodulated receive signals from the amplifiers 170 and 178 are passed to the terminals $A_L$ and $B_L$, respectively. These signals are amplified by the amplifiers 188 and 208 and the amplified signals are provided to the terminals $A_H$ and $B_H$. These are third and fourth phase demodulated signals. For each of the A and the B channels there is a low and a high amplitude signal. Thus, a low level signal with a large dynamic range and a high level signal with high resolution are utilized by the processing circuitry to increase the speed of processing and to enhance the resolution of the signals.

Further referring to FIG. 1, upon detection of an object within the field of the transmit and receive coils and the classification of the object as one which is desired, a detection signal is transmitted by the means of the DA signal to the transistor 230. The destination select signal DS2, is utilized to activate the output circuitry to pass the DA signal to indicate detection of an object. Once the DA and DS2 signals are applied to the output circuitry, the audio signal produced by the oscillator, which includes amplifier 248, is passed to the output amplifier transistors 268 and 280 to produce an audible output at the speaker 284. The amplitude of the output signal is determined by the amplitude of the DA signal which is in turn determined by the amplitude of the digitized receive signal. The voltage across capacitor 238 remains constant while DS2 is not activated, thus holding the audio amplitude constant.

Referring now to FIG. 3 the high and low amplitude A and B channel signals, $A_H$, $A_L$, $B_H$ and $B_L$ are input to the analog-to-digital converter 324. Each of these inputs is sampled when the address for that input is received over the lines A0, A1 and A2. Each sample of an input signal produces a corresponding digital word. The order and time of selection is determined by the program being executed by the microprocessor 374. The sampling of the signals is carried out at a sufficiently high rate such that the output signal provided to the operator is generated in a very short time, in terms of human response, after an object is detected in the field of the transmit and receive coils. Each of these signals is sampled at a typical rate of 100 samples per second.

Referring also to FIG. 4 the digitized receive signals are passed through the data bus 326 to the microprocessor 374 for immediate processing or to one of the RAMS 414 or 416 for storage and later processing.

The operating program for the metal detector circuit is permanently stored in the ROM 418. Upon activation of the metal detector circuit, the ROM 418 is immediately accessed for the first program instruction. Following the initialization of the program, the signal processing, as described below, together with monitoring inputs from the keyboard 440, receiving input data and generating output signals is carried out in accordance with the stored program.

Referring now to FIG. 5 the operator provides inputs to the metal detector circuit by operation of the switches in the keyboard 440. The switch closures are decoded and the switch information is transmitted through the bus 444 to the data bus 326. The closure of any one of the switches generates a data acquisition signal which is provided to the circuit 446 which activates a flag signal EF4 that is provided to the microprocessor 374. This flag is periodically checked by the microprocessor and upon detection of an active state the microprocessor receives the keyed information from the keyboard 440. Typical information which is input by the operator includes modes of operation, gains, audio levels, and target analysis parameters.

The detailed operation of the microprocessor signal processing system for the metal detector of the present invention is now described in reference to the flow diagrams in FIGS. 6–24.

Figure 6:
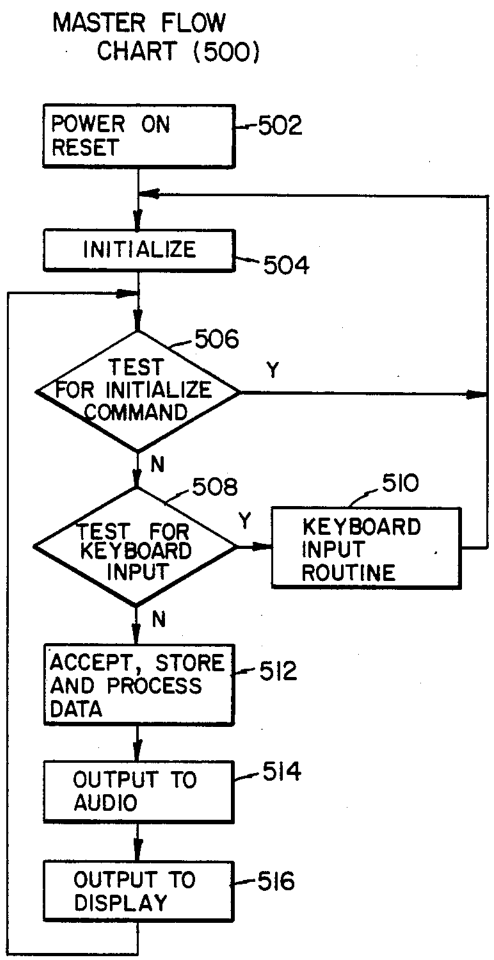
FIG. 6 is a master flow chart showing the general sequential operation of the signal processing system for the subject metal detector.

A master flow chart 500 is illustrated in FIG. 6. This flow diagram shows the overall processing flow for the signal processing of the described metal detector. A first routine 502 is power on reset. When power is applied to the metal detector, a clear command is input to pin 3 of the microprocessor 374. This clear command serves to put a selected address into the microprocessor program counter to start execution of the first instruction. Initial conditions are set in the registers and pointers. Routine 502 is further described in reference to FIG. 7. After the power on reset routine 502 is completed the program control enters an initialize routine 504. This routine is further described in reference to FIG. 8. The initialize routine 504 comprises establishing a predetermined set of conditions for various registers and selecting offset constants for the A and B channels.

Following the initialize routine 504 the program enters a decision block 506. This decision block tests for an initialize command which is provided through switch 378, shown in FIG. 4, to determine if the operator has commanded that the metal detector again be initialized. The decision block 506 is entered automatically following the initialize routine 504 and is entered after the overall completion of the signal processing operation shown in FIG. 6. If the test for block 506 is YES, the program is redirected back to the input of the initialize routine 504. If the test is NO, the program is directed to a decision block 508.

The decision block 508 is a test for any input from the keyboard 440, shown in FIG. 5. Whenever a key is depressed a flag is set on the EF4 line which is input to the microprocessor 374. If the test result is YES, a keyboard input routine 510 is executed. This routine is further described in reference to FIG. 9. The completion of the keyboard input routine returns the program to the initialize routine 504. If the test result is NO, the program is directed to a routine 512 to execute the operation of accept, store and process data. This routine includes all the operations of data acquisition and processing. Routine 512 is further described in FIG. 18. After the receive data has been acquired and processed, the program control is transferred to a routine 514 to output to audio the processed data. The routine 514 drives the audio output circuitry of the metal detector and is described in detail in FIG. 23.

After routine 514 the program control is transferred to an output to display routine 516 which provides signals to drive the LCD display 474. After routine 516 is completed, the program control is returned to the decision block 506 to repeat the cycle.

Each of the steps and routines which is included within the operations in the master flow chart 500 are now described in reference to FIGS. 7–24.

Figure 7:
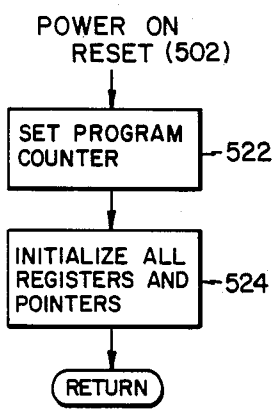
FIG. 7 is a flow diagram illustrating the power on reset operation.

The power on reset routine 502 is shown in FIG. 7. Upon application of power to the microprocessor the first operation is the set program counter step 522. A next step 524 is to initialize all registers and pointers. This step is done under program control and comprises storing predetermined initial conditions in the hardware registers and pointers. Following completion of step 524 the program control is returned to the initialize routine 504 as indicated in the master flow chart in FIG. 6.

Figure 8:
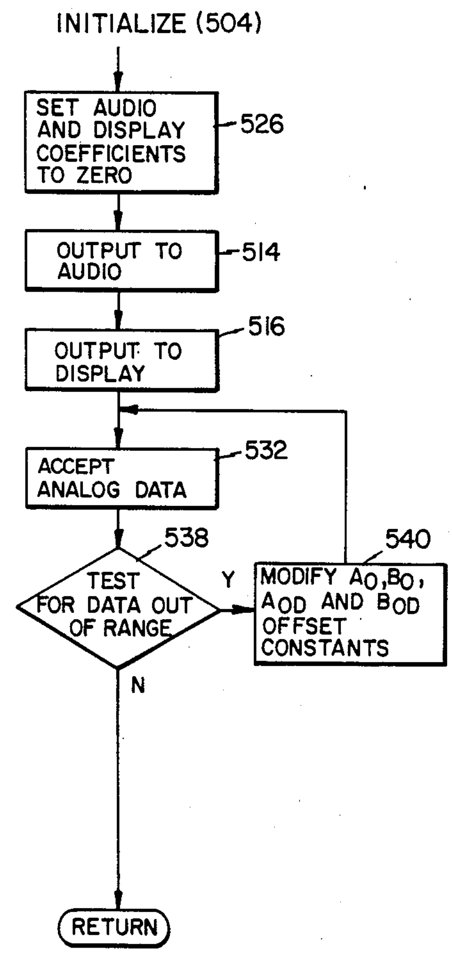
FIG. 8 is a flow diagram illustrating the initialization routine.

The initialize routine 504 is described in detail in FIG. 8. In a first step 526 the audio and display coefficients are set to 0. This sets the LCD display to 0 and prevents the generation of any audio output to the operator. After the audio display coefficients are set to 0, the program control executes the output to audio and output to display routines 514 and 516 to provide stored outputs to the audio output circuitry and the LCD display.

After completion of the output to display routine 516 the progam control goes to a routine 532 which accomplishes the function of accepting analog data. The detailed operation of this routine is further described in FIG. 19. This step basically serves to collect the amplitude states at the terminals for the $A_H$, $A_L$, $B_H$ and $B_L$ signals.

In a decision block 538, following routine 532, a test is carried out to determine if the analog data collected in routine 532 is out of range. The range limits are permanently stored in the read only memory 418. If the test shows that the data is out of range a step 540 is executed to modify and establish new offset constants $A_O$, $B_O$, $A_{OD}$ and $B_{OD}$. The constants $A_{OD}$ and $B_{OD}$ are transmitted as voltages which are stored on the capacitors 174 and 180 to provide offsets to the amplifiers 170 and 178 shown in FIG. 1. The constants $A_O$ and $B_O$ are maintained in the program. The constants $A_{OD}$ and $B_{OD}$ are the coarse offsets and $A_O$ and $B_O$ are the fine offsets.

If the test for block 538 indicates that the data is not out of range, the program control is returned to the decision block 506 shown in FIG. 6.

Figure 9:
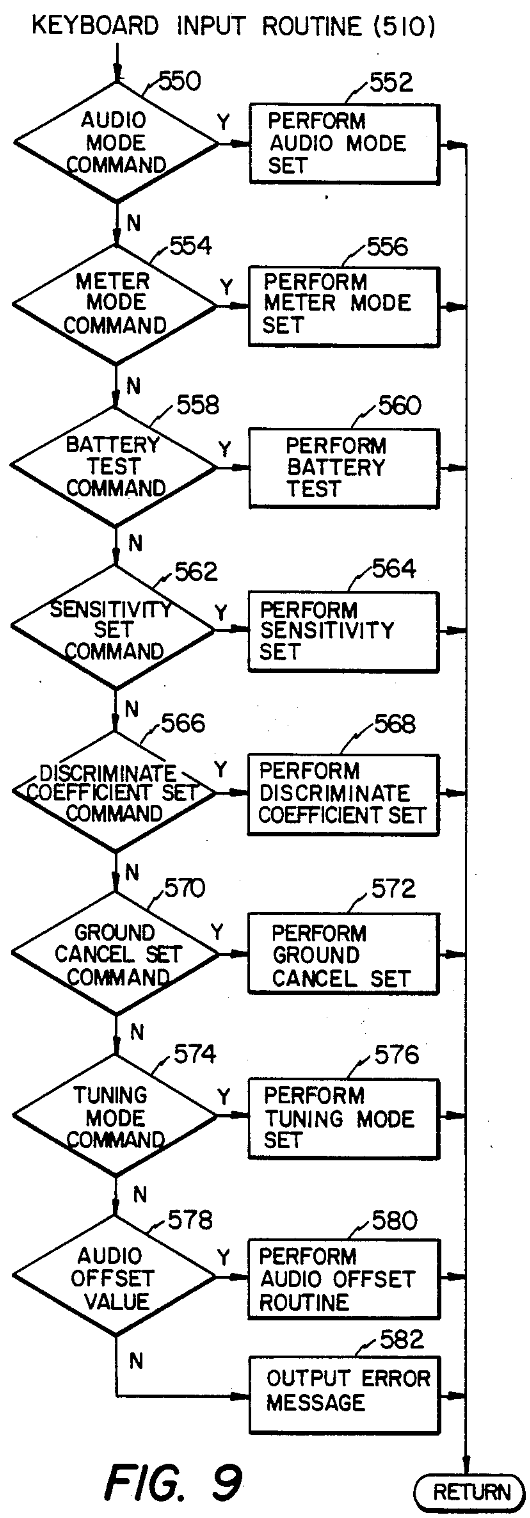
FIG. 9 is a flow diagram illustrating the keyboard input routine.

The keyboard input routine 510 is shown in FIG. 9. Functional commands as well as numerical information is input through the keyboard 440. The various functions are tested sequentially to determine which input has been generated by the operator. When a particular function has been selected the corresponding operational routine is carried out to accomplish the function. When the operational routine is completed, program control is returned to the master flow chart 500 of FIG. 6.

The test for keyboard commands and the corresponding functional operation are listed as follows:

| COMMAND | FUNCTION |
|---|---|
| audio mode command (550) | perform audio mode set (552) |
| meter mode command (554) | perform meter mode set (556) |
| battery test command (558) | perform battery test (560) |
| sensitivity set command (562) | perform sensitivity set (564) |
| discriminate coefficient | perform discriminate coefficient |
| set command (566) | set (568) |
| ground cancel set command (570) | perform ground cancel set (572) |
| tuning mode command (574) | perform tuning mode set (576) |
| audio offset value (578) | perform audio offset routine (580) |

If a key was pressed which did not designate a valid command, an output error message step 582 is executed. In each case, the program control is sent through the return back to the master flow chart 500 in FIG. 6. Each of the keyboard inputs and corresponding operational functions are described in detail in the following flow chart descriptions.

Figure 10:
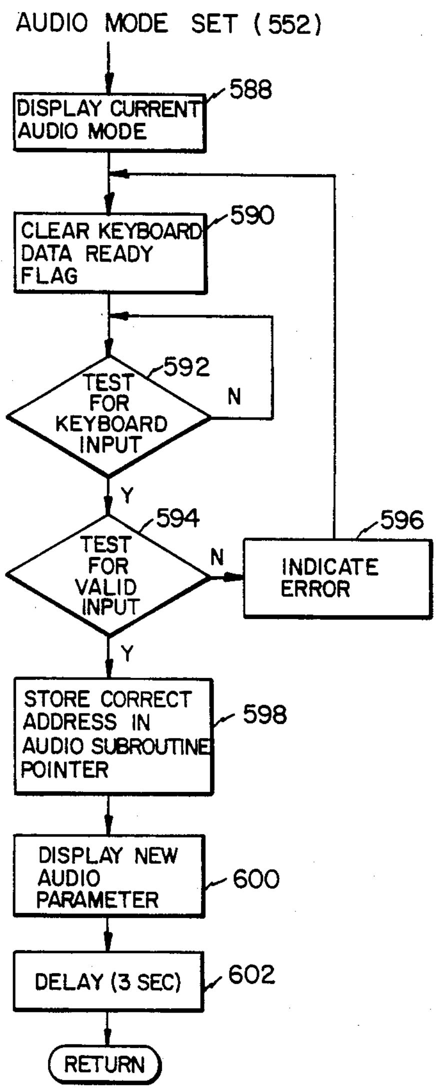
FIG. 10 is a flow diagram illustrating the audio mode set routine.

The perform audio mode set routine 552 is now described in reference to FIG. 10. A first step 588 is to display the current audio mode. There are a plurality of such modes available including ground cancelling and discrimination. The next step 590 is to clear the keyboard data ready flag. This flag is set whenever there is a keyboard entry and it must be cleared so that the program can detect a new entry. A decision block 592 to test for a keyboard input follows the clearing of the keyboard data ready flag. A negative response causes the program to loop through the block 592.

The next decision block 594 is to test for a valid input. Block 594 is entered following a positive response in block 592. Only certain keyboard inputs are appropriate in this audio mode set, other inputs are invalid. If there is not a valid input, an indicate error step 596 is executed to indicate to the operator that he has made an incorrect keyboard entry. After step 596 program control is returned to the input of step 590 to receive a new keyboard input. If a valid input is received for block 594, the program proceeds to a step 598 to store a correct address in the audio subroutine pointer. The function of step 598 is to set a pointer to be used by the audio output routine (block 866 of FIG. 23) so the desired output information is accessed for output.

Following step 598 the program proceeds to a step 600 to display the new audio parameter. This step displays the newly selected audio mode at the LCD. Following the step 600 there is a program delay 602 for approximately three seconds which is then followed by a return to the next function command in the keyboard input routine 510 shown in FIG. 9.

Figure 11:
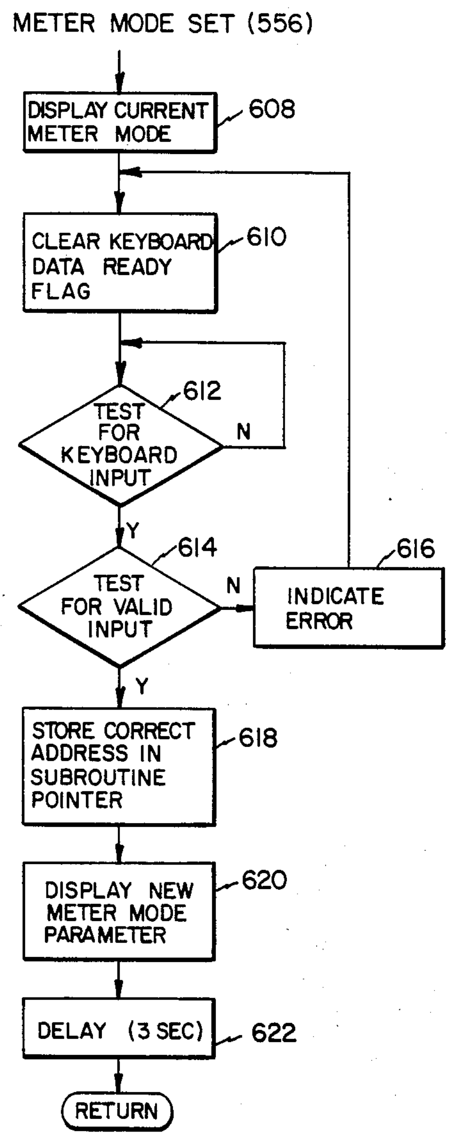
FIG. 11 is a flow diagram illustrating the meter mode set routine.

The next keyboard command 556 is meter mode set and this is illustrated in FIG. 11. A first step 608 of the meter mode set is to display the current meter mode. There are a plurality of meter modes available including signal strength, discrimination value, material coefficient and coin depth. The next step 610 is clear keyboard data ready flag. The next sequential operation is a decision block 612 which is to test for a keyboard input. When a keyboard input is received, the program proceeds to a decision block 614 to test for valid input. Only certain keyboard inputs are allowable. If a valid input is not received, an indicate error step 616 is executed to indicate to the operator than an incorrect keyboard input has been spotted. The program control is then returned to the input of the step 610 to again clear the keyboard data ready flag to receive a new keyboard input.

If the block 614 indicates that a valid input is received, a step 618 is executed to store the correct address in the subroutine pointer. Following this step is a step 620 to display new meter mode parameter, which was previously entered by the operator. After the initiation of the new display there is a delay step 622 for a period of approximately three seconds followed by a return to the keyboard input routine 510 in FIG. 9.

Figure 12:
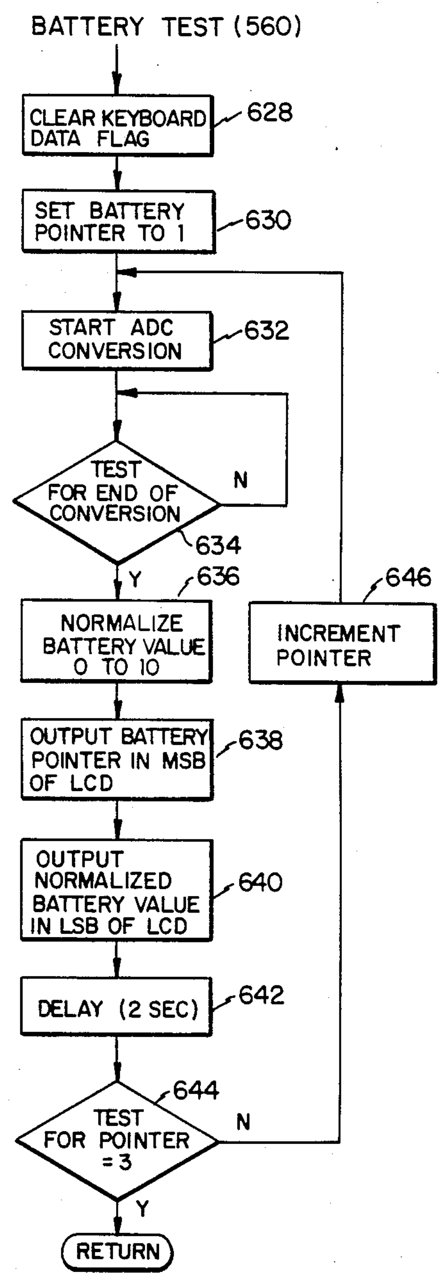
FIG. 12 is a flow diagram illustrating the battery test routine.

The perform battery test routine 560 is now described in reference to FIG. 12. A step 628 is executed to clear the keyboard data flag. In the next step 630 a battery pointer is set to 1. There is a battery pointer number for each of the three batteries. After the setting of the battery pointer a step 632 is executed to start the analog-to-digital converter (ADC). Next, there is a decision block 634 to test for end of conversion to detect the completion of the analog-to-digital conversion. The conversion is the measurement of a battery voltage. The battery voltages are input through the terminals labeled B1, B2 and B3. After the test for conversion is detected, the next step 636 is to normalize the battery voltage to a battery value in a range 0 to 10. The actual battery voltage is not indicated to the operator but there is shown a relative value of the battery voltage with a larger number indicating a higher voltage. Normalization is utilized with each of the batteries rather than voltages because the voltages of the various batteries can be different.

After the battery normalization, there is a step 638 to output the battery pointer number to the most significant bit (MSB) digit of the liquid crystal display 638. Next is a step 640 to output the normalized battery value to the least significant bit (LSB) of the LCD. After the normalized output is displayed there is a delay step 642 for approximately two seconds.

The next decision block 644 is a test for the battery pointer=3. If the pointer is not yet equal to 3 a step 646 is executed to increment the pointer to return the program to the start of the ADC conversion at step 632. When the test of the battery pointer reaches 3, all three batteries have been checked and the battery test routine returns to the keyboard input routine 510 in FIG. 9.

Figure 13:
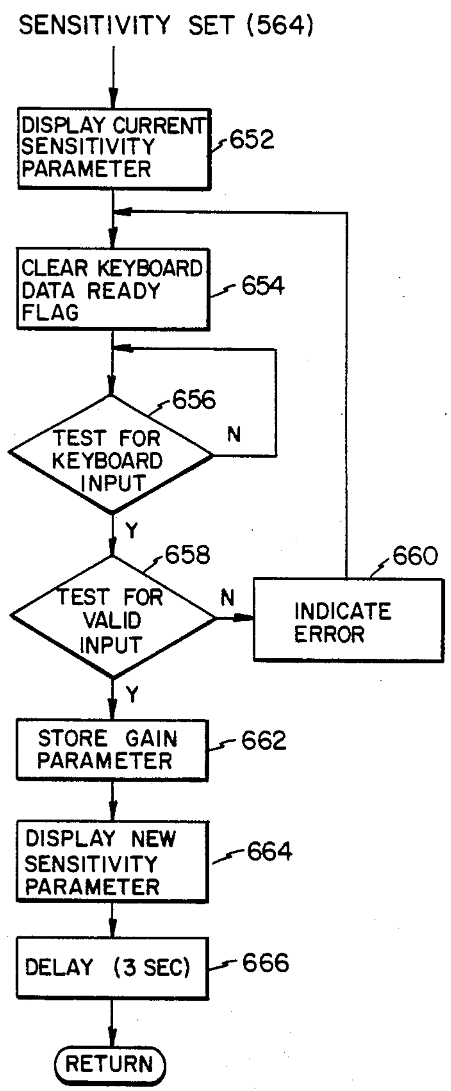
FIG. 13 is a flow diagram illustrating the sensitivity set routine.

The next keyboard input is the sensitivity set routine 564. The operator may wish to adjust the sensitivity of the metal detector so it will provide a greater or lesser response to a target. This is illustrated in FIG. 13. A first step 652 is to display the current sensitivity parameter. The next step 654 is to clear the keyboard data ready flag. The data ready flag is also referred to as the data flag. After the data ready flag is cleared, a decision block 656 is entered to test for a keyboard input. If there is no keyboard input, the program loops to make another check for a keyboard input. If there is a keyboard input, the program enters the decision block 658 to test for a valid input. Only predetermined inputs are allowable for the sensitivity set. Other inputs are not allowable. If there is no valid input, an indicate error step 660 is executed to provide an output to the operator to indicate that there has been an improper input. Following the indicate error step 660 program control is returned to clear the keyboard data ready flag in step 654 to await another keyboard input. If the test for a valid input for block 658 indicates that the keyboard input is valid, the keyboard input is stored by operation of a step 662 to store the gain parameter. The new sensitivity parameter is then displayed by operation of a step 664 to display new sensitivity parameter. Following the display step 664 there is a delay step 666 for a period of approximately 3 seconds. Program control then returns to master flow chart 500.

Figure 14:
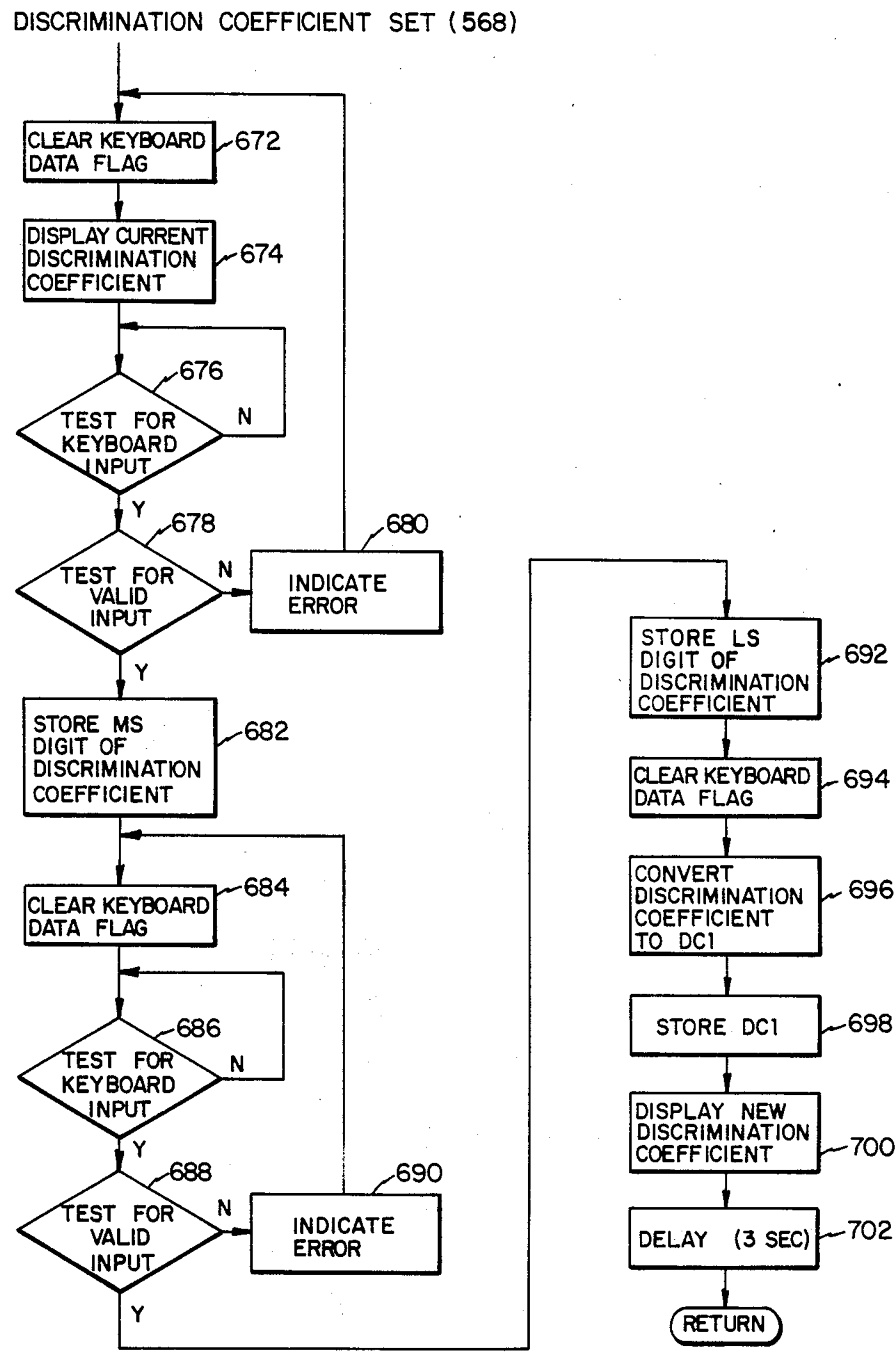
FIG. 14 is a flow diagram illustrating the discrimination coefficient set routine.

The discrimination coefficient set routine 568 is shown in detail in FIG. 14. The metal detector of the present invention can be programmed to indicate the detection of a selected class of target objects. This selection is determined by a discrimination coefficient which is scaled from 1 to 99 to represent a range of selection between conductive objects of differing material compositions. A first step 672 is to clear the keyboard data flag. The next step 674 is to display the current discrimination coefficient. From step 674 the program enters a decision block 676 to test for keyboard input. The test is repeated if there is no input. If there is an input, a decision block 678 is entered to test for valid input. Again, there are a fixed number of valid inputs and should the keyboard inputs which are received not fall within these predetermined inputs, the program will enter an indicate error step 680 to provide an indication of error to the operator and return the program to the input of step 672. If the input data is valid a step is entered to store the most significant digit of the discrimination coefficient. The next sequential step 684 is again to clear the keyboard data flag, followed by another test 686 for keyboard input. If the input is valid there is a test for valid input 688. If there is no valid input, an indicate error step 690 is carried out to indicate such condition to the operator and return the program to the clear keyboard data flag step 684. If valid data is received from the keyboard, a step 692 is executed to store the least significant (LS) digit of the discrimination coefficient.

After the storage of the LS discrimination coefficient there is a clear keyboard data flag step 694. The next step 696 is to convert the operator provided discrimination coefficient to DC1, which is the internally utilized discrimination coefficient.

The internally utilized discrimination coefficient DC1 is stored in a step 698. A step 700 is next executed to display the new discrimination coefficient. After the display is initiated there is a delay step 702 which halts the program for approximately three seconds and then returns to the master flow chart 500 in FIG. 6.

Figures 15, 16:
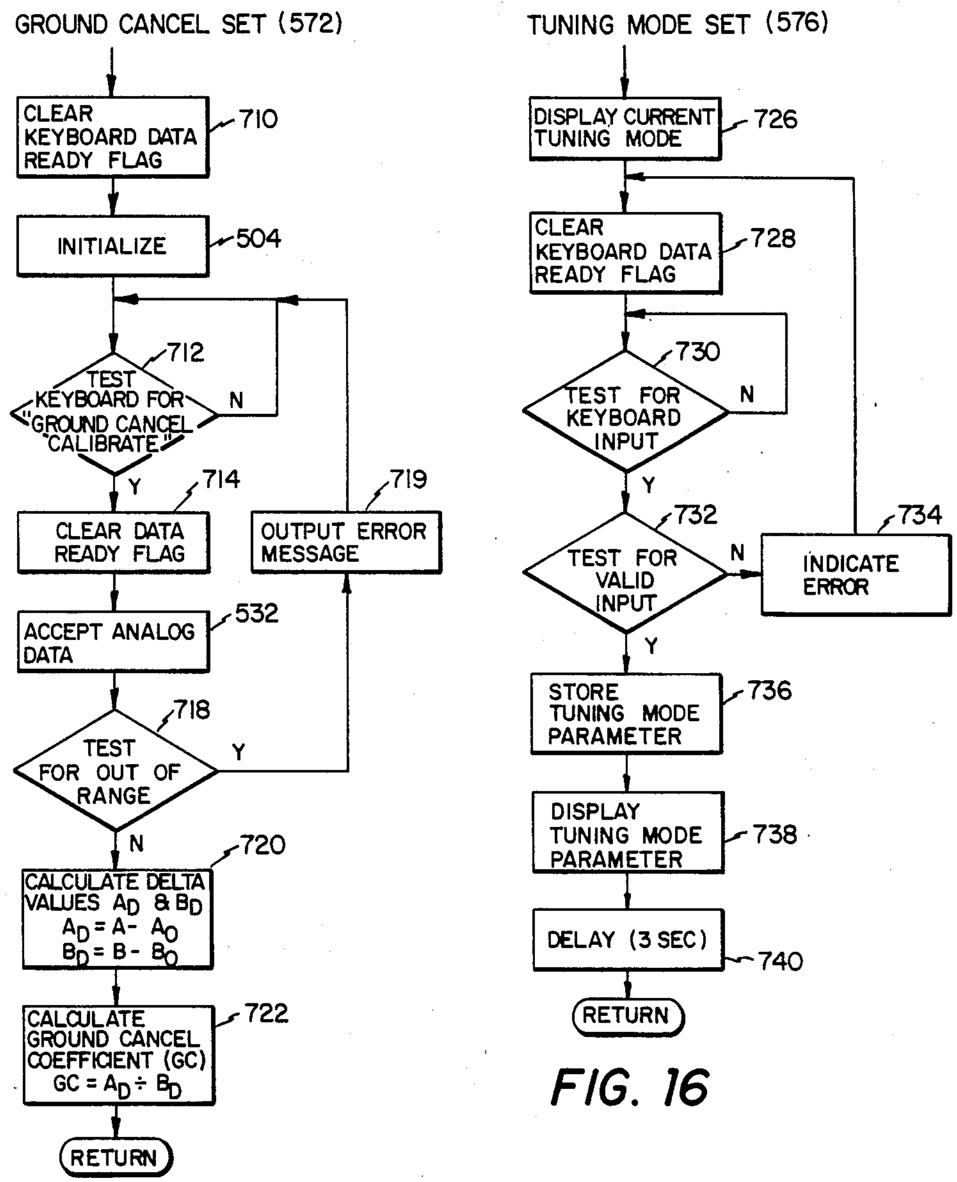
FIG. 15 is a flow diagram illustrating the ground cancel set routine.
FIG. 16 is a flow diagram illustrating the tuning mode set routine.

The ground cancel set routine 572 is now described in reference to FIG. 15. A first step 710 is to clear the keyboard data ready flag. The next step is the initialize routine 504 described in FIG. 8. This routine calculates the $A_O$, $B_O$, $A_{OD}$ and $B_{OD}$ offset constants for the condition when the search coil is not near the surface of the ground. Following the initialization is a decision block 712 to test the keyboard for the ground cancel calibrate input. If this keyboard input is not received, the step is repeated. If this keyboard input is received the program executes a clear data ready flag step 714.

After the data ready flag is cleared, the routine 532 is executed to accept analog data A and B. This is the data at the terminals $A_H$, $A_L$, $B_H$ and $B_L$ when the search coil of the detector is near the surface of the ground. After the data is accepted there is a decision block 718 to test for out of range. If the data is found to be out of range an output error message is generated by operation of step 719. Following the output error message, the program control is returned to the decision block 712 to test for a new keyboard entry. If the data is not delta values $A_D$ and $B_D$ wherein $A_D=A-A_O$ and $B_D=B-B_O$. The terms A and B are defined as $A=A_H+A_L$ and $B=B_H+B_L$. These high and low values are combined as a composite rather than algebraically summed.

After the delta values $A_D$ and $B_D$ are calculated, the program enters a step 722 to calculate a ground cancel coefficient (GC). This coefficient is defined as $GC=A_D \div B_D$. After the ground cancel coefficient is calculated, the program returns to the master flow chart 500 in FIG. 6.

The tuning mode set routine 576 is described in FIG. 16. A first step 726 is to display the current tuning mode. A plurality of tuning modes are available including manual and automatic. After the current tuning mode is displayed, a step 728 is executed to clear the keyboard data ready flag. After this flag is cleared, a decision block 730 is executed to test for keyboard input. If no keyboard input is received, the test is repeated. If there is a keyboard input, there is next a test 732 for valid input. There is stored a list of valid tuning mode states. If a valid state is not input through the keyboard, there is executed an indicate error step 734 to inform the operator that an incorrect input has been provided. Following step 734 the program control is returned to the input of the clear keyboard data ready flag step 728.

After the tuning mode parameters are received from the keyboard and the test for validity is completed there is a step 736 to store tuning mode parameter. Next there is executed a step 738 to display the tuning mode parameter. Finally, there is a delay step 740 for a period of approximately three seconds followed by a return to the master flow chart 500 in FIG. 6.

Figure 17:
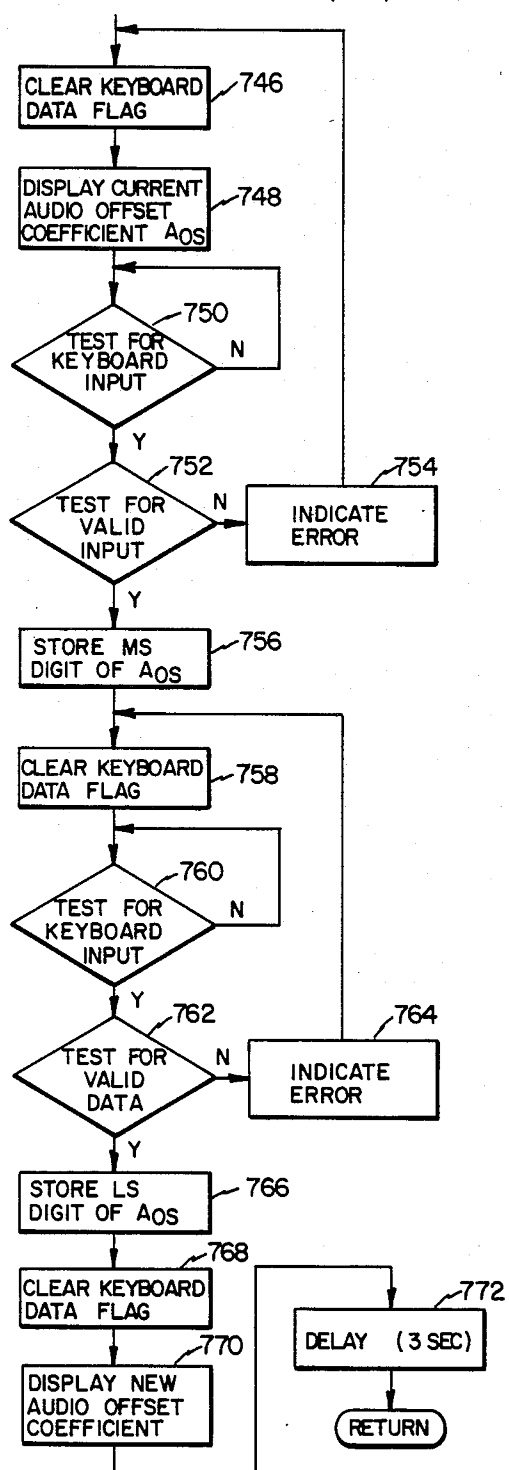
FIG. 17 is a flow diagram illustrating the audio offset routine.

The audio offset routine 580 is described in detail in reference to FIG. 17. The purpose of this routine is to set the threshold for the audio output. A first step 746 is to clear the keyboard data flag. The next step 748 is to display the current audio offset coefficient $A_{OS}$.

Following step 748 there is a decision block 750 to test for keyboard input. If there is no keyboard input, the program control continues to loop awaiting a keyboard input. If there is a keyboard input, the program enters a decision block 752 to test for valid input. If the input is not valid there is executed an indicate error step 754 which returns program control to the start of the audio offset routine 580. If the input is valid a step 756 is executed to store the most significant digit of the audio offset coefficient $A_{OS}$.

After the most significant digit of the audio offset coefficient is stored, the next step 758 is to clear the keyboard data flag. This is followed by a decision block 760 to test for keyboard input. The absence of an input results in a loop to continue searching for an input. If there is a keyboard input, there is executed a decision block 762 to test for valid data. If the data is not valid, a step 764 is executed to indicate an error to the operator. Step 764 returns the program to the clear keyboard data flag step 758. If valid data is detected there is executed a step 766 to store the least significant (LS) digit of the audio offset coefficient. The next sequential step is 768 to clear the keyboard data flag. This is followed by a step 770 to display the new audio offset coefficient. The next step is a delay 772 for a period of approximately three seconds followed by a return to the master flow chart 500 in FIG. 6.

Returning now to FIG. 6 for the master flow chart 500, should the test for keyboard input at block 508 be negative, the program control enters the routine 512 to accept, store and process data. This step is described in detail in FIG. 18.

Figure 18:
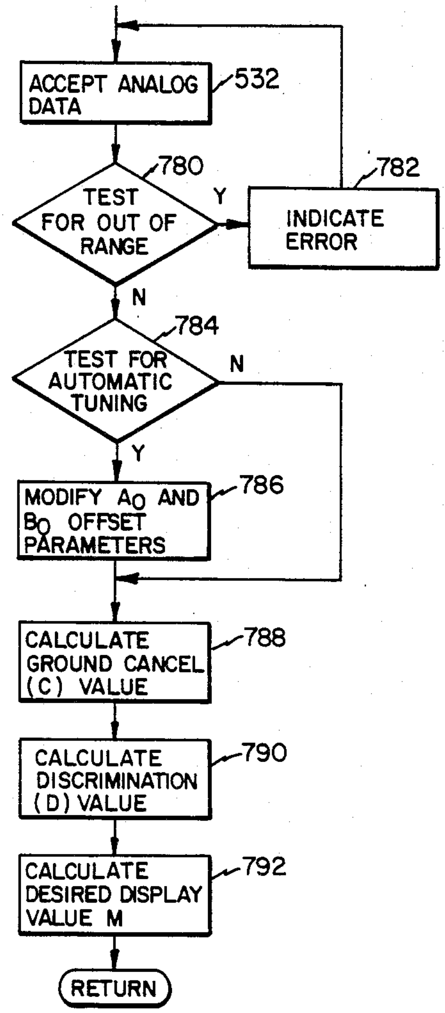
FIG. 18 is a flow diagram illustrating the operations of accept, process and store data received by the metal detector.

Referring now to FIG. 18, the first routine 532 is to accept analog data. This step is described in detail in FIG. 19. After routine 532 there is a decision block 780 to test for out of range. This step compares the measured amplitude of the analog data with preset limits. If the newly acquired analog data exceeds the selected range, there is executed a step 782 to indicate an error to the operator. The program control is then returned to the input of the routine 532. If the test shows that the data is not out of range, the program enters a decision block 784. The purpose of this block is to test to determine if automatic tuning has been selected in a keyboard input by the operator. If the automatic tuning mode has been selected, there is entered a step 786 to modify the $A_O$ and $B_O$ offset parameters an incremental amount so the system slowly moves toward an equilibrium condition of zero output.

If the test for automatic tuning is negative, the step 786 is skipped and the program control goes directly to a routine 788 to calculate a ground cancel (C) value. This routine is shown in detail in FIG. 20.

After the value C has been calculated, there is executed a routine 790 to calculate a discrimination (D) value. This step is described in detail in FIG. 21.

After the D value has been calculated there is a routine 792 to calculate a desired display value (M) which represents a selected meter mode. The routine 792 is shown in detail in FIG. 22. Following calculation of the M value the program control is transferred to the routine 514 shown in the master flow chart 500 in FIG. 6.

Figure 19:
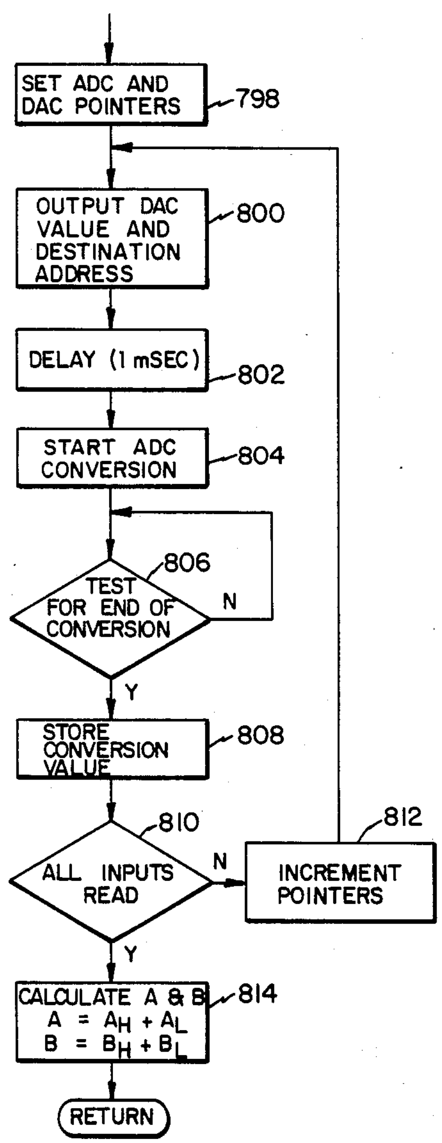
FIG. 19 is a flow diagram illustrating the operation of accept analog data.

The accept analog data routine 532 is shown in detail in FIG. 19. A first step 798 is the setting of the ADC and DAC pointers. This selects the sources and destinations for the conversions. From step 798 there is a step 800 to output the DAC value and destination address. The DAC 360 has a demultiplexer on its output. To output an analog value, the step 800 includes addressing the DAC, outputting a data value to the DAC, and outputting a value to the demultiplexer to direct the analog signal to the correct location.

Following the completion of step 800 there is entered a delay step 802 to cause a 1 milisecond delay. Following step 802 there is a step 804 to start the ADC conversion. After the analog-to-digital conversion is started there is entered a decision block 806 to test for end of the conversion. A loop is continued until the conversion is completed. When the conversion is completed, a step 808 is executed to store the conversion value.

After completion of the storage of the conversion value, there is entered a decision block 810 to test if all inputs have been read. This step comprises reading the ADC and DAC pointers to determine if all inputs have been read. If all inputs have not been read, there is executed a step 812 to increment the ADC and DAC pointers. From step 812 the program control is returned to step 800 to collect additional analog data.

After all of the analog inputs have been accepted and a positive response is generated in response to the decision block 810, there is executed a step 814 to calculate the A and B quantities. The quantity A is equal to the composite of the high and low signals ($A_H$ and $A_L$) of the A channel. The quantity B is equal to the high and low quantities ($B_H$ and $B_L$) for the B channel. After these values have been calculated the program control is returned to the imediate preceding routine, either the block 538 in FIG. 8, the block 718 in FIG. 15 or the block 780 in FIG. 18.

Figure 20:
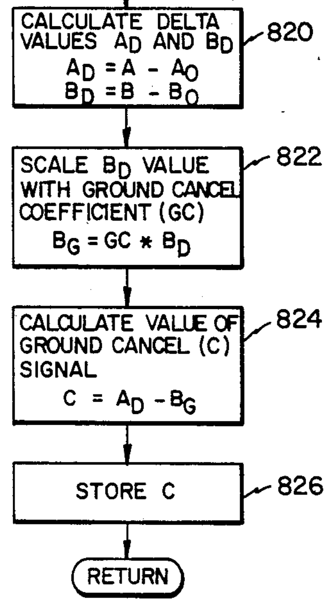
FIG. 20 is a flow diagram illustrating the calculate ground cancel (C) value.

The calculate ground cancel (C) value step 788 is described in detail in FIG. 20. A first step 820 is to calculate delta values $A_D$ and $B_D$ wherein $A_D=A-A_O$ and $B_D=B-B_O$. The next sequential step 822 is to scale the BD value with the ground cancel coefficient (GC) wherein $B_G=GC\times B$. The next step 824 is to calculate the value of the ground cancel (C) signal wherein $C=A_D-B_G$. The final step 826 comprises storing the calculated ground cancel value C. Following completion of step 826 the program control is returned to routine 790 of the accept, process and store data routine 512 in FIG. 18.

Figure 21:
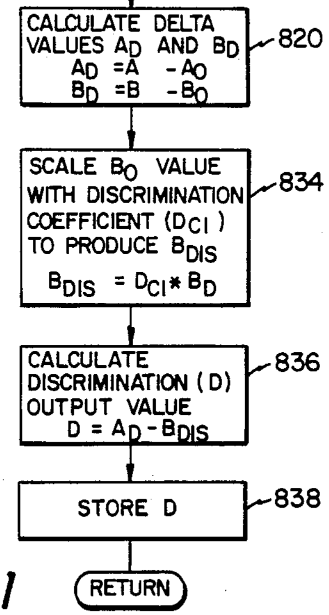
FIG. 21 is a flow diagram illustrating the calculate discrimination (D) value.

The calculate discrimination (D) value routine 790 is described in detail in FIG. 21. The first step 820 is to calculate delta values $A_D$ and $B_D$ as described above. The next step 834 is to scale the $B_O$ value with the discrimination coefficient ($D_{C1}$) to produce $B_{DIS}$. This relationship is $B_{DIS}=DC1\times B_D$. A further step 836 is to calculate the discrimination (D) output value wherein $D=A_D-B_{DIS}$. A final step 838 comprises storing the calculated D value. After completion of step 838 the program control is returned to routine 792 in FIG. 18.

Figure 22:
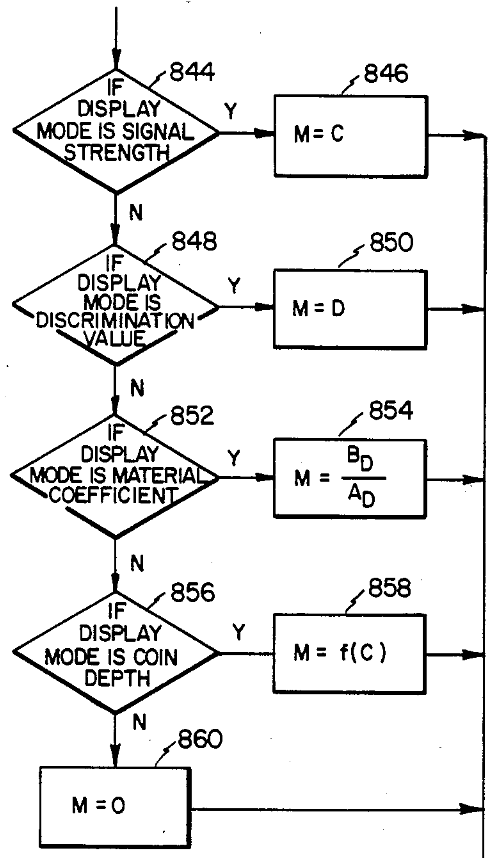
FIG. 22 is a flow diagram illustrating the calculate desired display value (M)

The routine 792 to calculate the desired display value M is described in detail in FIG. 22. A first decision block 844 is to determine if the display mode is signal strength. This is the term "C". If the test result is YES a step 846 is entered to select the M value for the measured signal strength. If the display mode is not signal strength a decision block 848 is entered to determine if the display mode is discrimination value. If the test is YES a step 850 is executed to select M to be equal to the previously selected discrimination value (D).

If the response to decision block 848 is negative, a decision block 852 is entered to determine if the display mode is material coefficient. If the response is YES, a step 854 is executed to calculate M which is equal to $B_D$ divided by $A_D$. If the response to decision block 852 is negative, a decision block 856 is entered to determine if the display mode is coin depth. In this case the M value is a function of the value C, as shown in step 858, and is defined in a look up table stored in the ROM 418. If none of the previous modes are selected, the meter value is set to zero as shown in step 860. Following the calculation of the M value the program control is transferred to the return block in FIG. 18.

Figure 23:
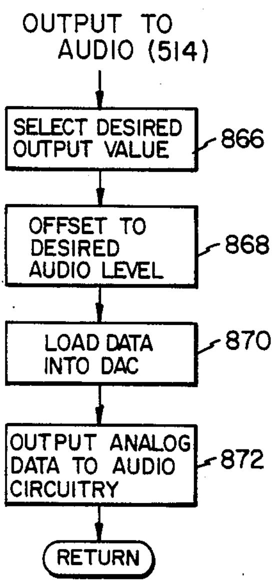
FIG. 23 is a flow diagram illustrating the output to audio routine.

The output to audio routine 514 is described in detail in FIG. 23. A first step 866 is executed to select the desired value to be output as defined by the pointer set in FIG. 10. This can be the quantity C or D. After step 866 is executed there is entered a step 868 to offset to the desired audio level. A next step 870 is to load the data into the DAC 360. The following step 872 is to output the analog data to the audio circuitry. Following completion of this step the program control is returned to the master flow chart 500 in FIG. 6 or to the initialize routine 504 in FIG. 8.

Figure 24:
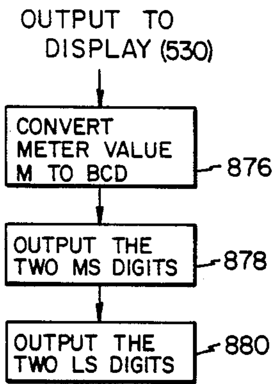
FIG. 24 is a flow diagram illustrating the output to display routine.

The output to display step 530 shown in FIGS. 6 and 8 is illustrated in FIG. 24. A first step 876 is executed to convert the meter value M to binary coded decimal (BCD). After this conversion, a step 878 outputs the two most significant digits of the meter valve to the LCD 474. The next step 880 outputs the two least significant digits of the meter value M to the liquid crystal display 474. Following completion of the output to display step 530 the program control is returned to the master flow chart shown in FIG. 6 or to the initialize routine 504 in FIG. 8.

The preferred microprocessor for the present invention is a model CDP1802 manufactured by RCA. This unit is selected for its low power consumption. The electrical interface, pin definitions and instructions codes for programming this microprocessor are described in the RCA Solid State DATABOOK titled "RCA COS/MOS MEMORIES, MICROPROCESSORS, AND SUPPORT SYSTEMS", copyright 1979 by RCA Corporation. The CDP1802 is described in particular at pages 17–36. Given the description for signal acquisition, processing, and output presented herein and the reference material for the CDP1802, the detailed programming for the microprocessor can be accomplished using conventional programming techniques well known in the art.

The overall signal processing operation in accordance with the present invention is now described in reference to the FIGURES. A summary of the mathematical terms used in the present application and a definition for each term is presented in Table 1 below.

TABLE 1

| Term | Definition |
|---|---|
| $A_H$ = | High Amplitude Segment of A-Channel |
| $A_L$ = | Low Amplitude Segment of A-Channel |
| $B_H$ = | High Amplitude Segment of B-Channel |
| $B_L$ = | Low Amplitude Segment of B-Channel |
| $A_O$ = | A-Channel Program Offset |
| $B_O$ = | B-Channel Program Offset |
| $A_{OD}$ = | A-Channel Hardware Offset |
| $B_{OD}$ = | B-Channel Hardware Offset |
| $A_D$ = | Compensated A-Channel Data |
| $B_D$ = | Compensated B-Channel Data |
| GC = | Ground Cancellation Coefficient |
| $B_G$ = | B-Channel Data Scaled for Ground Cancelling |
| C = | Ground Cancelled Signal |
| D = | Discrimination Value |
| $D_C$ = | Discrimination Coefficient |
| $B_{DIS}$ = | B-Channel Data Scaled for Discrimination |

The signal processing equations noted above are summarized in Table 2.

TABLE 2

| Equation | No. |
|---|---|
| $A = A_H + A_L$ | (1) |
| $B = B_H + B_L$ | (2) |
| $A_D = A - A_O$ | (3) |
| $B_D = B - B_O$ | (4) |
| $GC = A_D \div B_D$ | (5) |
| $B_G = GC * B_D$ | (6) |
| $C = A_D - B_G$ | (7) |
| $B_{DIS} = D_{CI} * B_D$ | (8) |
| $D = A_D - B_{DIS}$ | (9) |

As described previously, quadrature information is processed through the A and B channels shown in FIG. 1, to produce signal amplitudes at the outputs of amplifiers 170 and 178 with the signals corresponding to the amplitudes of the quadrature signal components. By means of the amplifiers 188 and 208 there are produced high and low level A and B channel signals. The basic A and B channel signals comprise the summation of the high and low channel components. This is shown as equations (1) and (2) in Table 2.

The quadrature A and B channels may have residual amplitude components which are not a function of the target. These signal components can be due to imperfect mechanical alignment of the transmit and receive coils resulting in a non zero mutual coupling coefficient, conductive materials in a close but fixed proximity of the coil (i.e. shields, wires, stems, etc), as well as changes in the coils and electronic components due to thermal variations. There can also be changes due to soil conditions. In order to null the metal detector circuit, there are provided amplitude offset quantities for the A and B channels. A coarse offset is provided by the quantities $A_{OD}$ and $B_{OD}$. These signals are produced by the digital-to-analog converter 360, as a function of the signal processing, and transmitted by means of switches 154 and 162 to capacitors 174 and 180. These signals are stored on the capacitors to provide voltage offsets at the inputs of amplifiers 170 and 178. This is termed the hardware offset.

Program offset quantities $A_O$ and $B_O$ are calculated by operation of the signal processing program within the metal detector. These quantities comprise the outputs of the A and B channels, after implementation of the hardware offsets, when the outputs of these channels should be a zero state.

The resulting data which is utilized by the signal processing program comprises the quantities $A_D$ and $B_D$ which are defined in the equations (3) and (4) in Table 2.

The metal detector of the present invention provides ground cancellation, that is, the ability to eliminate the effect of ground mineralization from the receive signal. The quantity which is used to produce this cancellation is termed the ground coefficient (GC). It is produced through the following steps. The operator first holds the search head, which includes the transmit coil 12 and receive coil 56, at a substantial height above the ground. This should be high enough to eliminate any effect of the ground mineralization or objects in the soil. The operator then activates the function for automatically tuning the metal detector. The operation of the signal processing then produces the four offset quantities discussed above. Next, the operator holds the search head just slightly above the ground and activates the function of ground cancel set, which is described in routine 572 in FIG. 15. New quantities $A_D$ and $B_D$ are produced. The GC value is then calculated in accordance with equation (5) in Table 2.

The next step in producing the ground cancelled signal (C) is to calculate the quantity $B_G$ as defined in equation (6) in Table 2. After the calculation of $B_G$, the ground cancelled signal C itself is calculated, as determined by equation (7) in FIG. 2. This output signal is then converted by the DAC 60 to an analog signal which is gated to the analog output circuitry to produce an analog response for the operator. The calculated quantity C is also transmitted to the LCD 474 to produce a digital display for the operator.

The metal detector of the present invention further has the capability of providing discrimination between various types of targets. The operator inputs through the keyboard 440 a two-digit number in the range of 1–99. This is the range of discrimination selection. The operator discrimination coefficient is converted, by operation of routine 790, using a look up table, into a discrimination coefficient $D_{CI}$. The $D_{CI}$ value is utilized by the program in the processing of the detected signals. The scaled B channel discrimination value $B_{DIS}$ is produced as shown in equation (8) in Table 2. The final discrimination value D is produced as shown in equation (9) in Table 2. The discrimination value D, like the ground cancelled signal C, is output to the audio output circuitry as well as to the liquid crystal display 474 to indicate to the operator the detection of a target which is within the range of the selected discrimination coefficient.

In summary, the present invention comprises a metal detector having digital signal processing to provide selectable ground cancellation and discrimination by operation of a program which is executed by a microprocessor. The detector can produce both an audio and a digital output.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. A metal detector circuit, comprising:

means for generating an oscillatory signal;

a transmit coil connected to receive said oscillatory signal and generate an electromagnetic field therefrom;

a receive coil located in said electromagnetic field for producing a receive signal due to said electromagnetic field;

means for phase demodulating said receive signal with respect to the phase of said oscillatory signal to produce a phase demodulated signal;

means for digitizing said phase demodulated signal to produce digital signal samples, said means for digitizing having a predetermined amplitude input range for signals received thereby;

digital signal processing means connected to receive said digital signal samples and produce therefrom an output signal in accordance with a stored signal processing program to indicate detection of an object;

means responsive to a digital offset signal produced by said digital signal processing means for generating a corresponding analog offset signal;

means for combining said analog offset signal with said phase demodulated signal;

said digital signal processing means producing said digital offset signal as a fixed amplitude signal when the amplitude of said phase demodulated signal goes beyond said predetermined input range for said means for digitizing as indicated by said digital signal samples received from said means for digitizing, said analog signal driving the signal provided to said means for digitizing to within said predetermined input range; and means for generating a target indication signal in response to said output signal.

2. A metal detector circuit as recited in claim 1 wherein said digital signal processing means comprises:

a read only memory having said stored signal processing program therein; and a microprocessor connected to receive said digital signal samples and connected to said read only memory for executing said stored signal processing program.

3. A metal detector circuit as recited in claim 2 wherein said digital signal processing means includes:

a random access memory connected to said microprocessor; and a digital-to-analog converter connected to said microprocessor for producing said output signal.

4. A metal detector circuit as recited in claim 1 wherein said means for generating a target identification signal comprises a tone generator circuit which is modulated by said output signal.

5. A metal detector circuit as recited in claim 1 wherein said means for generating a target indication signal comprises a digital display driven by said output signal.

6. A metal detector circuit as recited in claim 1 including means for storing an offset voltage to offset the amplitude of said digital signal samples.

7. A metal detector circuit, comprising:

means for generating an oscillatory signal;

a transmit coil connected to receive said oscillatory signal and generate an electromagnetic field therefrom;

a receive coil located in said electromagnetic field for producing a receive signal due to said electromagnetic field;

first and second phase demodulators having said receive signal and said oscillatory signal provided thereto for producing respective first and second phase demodulated signals;

means for providing first and second relative phase relations between the receive signal and the oscillatory signal provided respectively to said first and second phase demodulators;

means for digitizing said phase demodulated signals to produce digital signal samples, said means for digitizing having a predetermined amplitude input range for signals received thereby;

digital signal processing means for receiving and processing said digital signal samples in accordance with a stored signal processing program to produce a digital output signal;

means responsive to a digital offset signal produced by said digital signal processing means for generating a corresponding analog offset signal;

means for combining said analog offset signal with either of said phase demodulated signals;

said digital signal processing means producing said digital offset signal as a fixed amplitude signal for combining with one of said phase demodulated signals when the amplitude of said one phase demodulated signal goes beyond said predetermined input range for said means by digitizing as indicated by said digital signal samples received from said means for digitizing, said analog offset signal driving the signal provided to said means for digitizing to within said predetermined input range; and means for producing a digital display output in response to said digital output signal, said response for indicating detection of an object in said electromagnetic field.

8. A metal detector circuit as recited in claim 7 including:

means for converting said digital output signal into an analog output signal; and tone generator means responsive to said analog output signal for generating an audio response to indicate detection of an object in said electromagnetic field.

9. A metal detector circuit as recited in claim 7 including first and second amplifiers connected respectively to the outputs of said phase demodulators for producing third and fourth phase demodulated signals which are input to said means for digitizing.

10. A metal detector circuit as recited in claim 7 including a keyboard for entering parameters into said digital signal processing means.

11. A metal detector circuit as recited in claim 7 wherein said digital signal processing means includes:

a read only memory for storing said signal processing program;

a microprocessor for executing said signal processing program; and a random access memory for storing information for use by said microprocessor.

12. A metal detector circuit as recited in claim 7 including means for storing offset voltages to offset the amplitudes of said first and said second phase demodulated signals.

13. A metal detector circuit, comprising:

an oscillator for generating a transmit signal, a transmit coil connected to receive said transmit signal for generating an electromagnetic field, a receive coil located in said electromagnetic field for producing a receive signal through inductive coupling from said transmit coil, means connected to receive said transmit signal and said receive signal for phase demodulating said receive signal to produce first and second phase demodulated signals, means for digitizing said first and second phase demodulated signals to produce digital signal samples said means for digitizing having a predetermined amplitude input range for signals received thereby, a digital communication bus connected to receive said digital signal samples from said means for digitizing;

a digital memory connected to said communication bus, said memory including a stored program therein, a microprocessor connected to said communication bus, said microprocessor executing said stored program to process said digital signal samples and generate a digital output signal to indicate detection of an object in said electromagnetic field, a digital-to-analog converter connected to receive digital offset signals from said microprocessor for producing respective analog offset signals, means for combining said analog offset signals with said phase demodulation signals, said microprocessor producing one of said digital offset signals as a fixed amplitude signal when one of said phase demodulated signals exceeds said predetermined input range for said means for digitizing as indicated by said digital signal samples received from said means for digitizing, said one analog offset signal driving the signal provided by said means for digitizing to within said predetermined input range; and output means connected to said microprocessor for receiving said digital output signal and generating therefrom a target indication signal.

14. A metal detector circuit as recited in claim 13 wherein said first and second phase demodulated signals represent quadrature phase components of said receive signal.

15. A metal detector circuit, comprising:

an oscillator for generating a transmit signal, a transmit coil for receiving said transmit signal to generate an electromagnetic field, a receive coil in said electromagnetic field for producing a receive signal through inductive coupling from said transmit coil, a first switch having a signal input connected to receive said receive signal and a control input connected to receive said transmit signal, a second switch having a signal input connected to receive said receive signal and a control input connected to receive said transmit signal, means for providing a first relative phase shift between said transmit signal and said receive signal provided to said first switch and for providing a second relative phase shift between said transmit signal and said receive signal provided to said second switch, wherein said receive signal is phase demodulated by operation of said switches to produce first and second demodulation signals respectively at the outputs of said first and said second switches, means for digitizing said first and said second demodulation signals to produce digital signal samples, said means for digitizing having a predetermined amplitude input range for said signals received thereby, a digital bus connected to said means for digitizing for conveying said digital samples, a digital memory connected to said bus, said memory having a signal processing program stored therein, a microprocessor connected to said bus for receiving said digital signal samples and executing said signal processing program to generate digital offset signals having fixed amplitudes and to generate a digital output upon detection of an object in said field, a digital-to-analog converter connected to said bus for receiving said digital output for generating therefrom an analog output signal and for receiving said digital offset signals for generating therefrom respective analog offset signals, means for combining said analog offset signals with said phase demodulation signals, said microprocessor producing one of said digital offset signals when one of said phase demodulated signals exceeds said predetermined input range for said means for digitizing as indicated by said digital signal samples received from said means for digitizing, said analog offset signals driving the signals provided to said means for digitizing to within said predetermined input range, and output means connected to said microprocessor for receiving said digital output signal and generating therefrom a target indication signal.

16. A method of operation for a metal detector comprising the steps of:

generating an electromagnetic field;

producing a receive signal derived from said electromagnetic field wherein said receive signal is variable dependent upon the presence of ferrous and/or conductive material in said electromagnetic field;

phase demodulating said receive signal with respect to the phase of said electromagnetic field to produce a phase demodulated signal;

digitizing said phase demodulated signal to produce digital signal samples, when said phase demodulated signal is within a predetermined input amplitude range;

processing said digital signal samples in accordance with a stored signal processing program to produce an output signal to indicate detection of an object in said electromagnetic field, generating a digital offset signal in response to said processing of said digital signal samples in accordance with said stored signal processing program, when the amplitude of said phase demodulated signal exceeds said predetermined input amplitude range, generating an analog offset signal in response to said digital offset signal, combining said analog offset signal with said phase demodulated signal prior to said step of digitizing, said analog offset signal for driving said phase demodulated signal to within said predetermined input range; and driving an output circuit with said output signals to produce a response for indicating detection of an object in said electromagnetic field.

17. A method as recited in claim 16 wherein said step of driving an output circuit to produce a response comprises producing a digital display and generating an audio tone.

18. A method as recited in claim 16 including a step of phase demodulating said receive signal with respect to a reference signal that is phase related to said electromagnetic field.

19. A method as recited in claim 16 including a step of generating an offset signal which is used to offset the amplitude of said digital signal samples.

20. A method as recited in claim 16 wherein the step of generating digital signal samples comprises phase demodulating said receive signal and digitizing said phase demodulated receive signal.

21. A method as recited in claim 16 wherein the step of processing said digital signal samples comprises measuring the amplitude of said digital signal samples and generating said output signal to be proportional to the amplitude of said digital signal samples.

22. A method of operation for a metal detector, comprising the steps of:

generating an oscillatory signal;

generating an alternating electromagnetic field by passing said oscillatory signal through a coil;

producing a receive signal derived from said electromagnetic field wherein said receive signal is variable dependent upon the presence of ferrous and/or conductive material in said electromagnetic field;

phase demodulating said receive signal with respect to a first reference signal derived from said oscillatory signal to produce a first phase demodulated signal;

phase demodulating said receive signal with respect to a second reference signal derived from said oscillatory signal to produce a second phase demodulated signal;

digitizing said first and second said phase demodulated signals to produce digital signal samples when said phase demodulated signals are within a predetermined amplitude input range;

processing said digital samples in accordance with a stored signal processing program to produce an output signal to indicate detection of an object;

generating first and second digital offset signals by operation of said signal processing program in response to said digital signal samples when the amplitude of said demodulated signals exceeds said predetermined amplitude input range, generating analog offset signals in response to said digital offset signals, combining respectively said analog offset signals with said phase demodulated signals prior to said step of digitizing;

said analog offset signals for driving said respective phase demodulated signals to within said predetermined input range; and driving an output circuit with said output signal to produce a response, said response for indicating detection of an object in said electromagnetic field.

23. A method of operation for metal detector as recited in claim 22 wherein said first and said second reference signals are in phase quadrature.

24. A method of operation for a metal detector as recited in claim 22 wherein the step of processing said digital signal samples comprises measuring the amplitudes of said samples and generating said output signal as a function of the amplitude of said digital signal samples.

25. A method of operation for a metal detector as recited in claim 22 wherein the step of processing said digital signal samples comprises measuring the ratio of the amplitudes of said first and said second phase demodulated signals and generating said output signal when said measured ratio is within a preset range.

26. A method of operation for a metal detector as recited in claim 22 including the steps of:

determining a ground cancel coefficient by comparing a first reading of said phase demodulated signals taken when said field does not include mineralized ground to a second reading of said phase demodulated signals when said field includes mineralized ground; and altering said digital signal samples by said ground cancel coefficient to eliminate mineralized ground effects from said output signal.

27. A method of operation for a metal detector as recited in claim 22 including the steps of:

receiving an auto-tune command; and determining the amplitudes of a selected set of said digital signal samples for said first and said second phase demodulated signals and selecting offset quantities which when added to said selected set of digital signal samples produces a null condition for said output signal.

* * * * *